United States Patent
Lesea

(10) Patent No.: US 7,062,692 B1
(45) Date of Patent: Jun. 13, 2006

(54) DUTY CYCLE CHARACTERIZATION AND ADJUSTMENT

(75) Inventor: Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 441 days.

(21) Appl. No.: 10/255,502

(22) Filed: Sep. 26, 2002

(51) Int. Cl.
*G01R 31/28* (2006.01)

(52) U.S. Cl. .................... 714/725; 714/736

(58) Field of Classification Search ............. 714/725, 714/724, 729, 730, 731, 732, 733, 736, 740, 714/742, 25, 27, 30, 32, 726; 327/175
See application file for complete search history.

(56) References Cited

U.S. PATENT DOCUMENTS

| | | | | |
|---|---|---|---|---|
| 5,256,916 A | * | 10/1993 | Thurston | 326/65 |
| 6,219,305 B1 | * | 4/2001 | Patrie et al. | 368/113 |
| 6,324,485 B1 | * | 11/2001 | Ellis | 702/117 |
| 6,687,865 B1 | * | 2/2004 | Dervisoglu et al. | 714/726 |
| 2002/0079940 A1 | * | 6/2002 | Boerstler et al. | 327/175 |

* cited by examiner

*Primary Examiner*—Albert Decady
*Assistant Examiner*—Dipakkumar Gandhi
(74) *Attorney, Agent, or Firm*—W. Eric Webostad; LeRoy D. Maunu; Edel M. Young

(57) ABSTRACT

Method and apparatus are described for duty cycle determination and adjustment. More particularly, an output signal is sampled and provided to duty cycle check circuitry which characterizes the duty cycle of the sampled output signal. This characterization may be provided to a wafer prober or integrated circuit tester to determine whether duty cycle is within an acceptance range. Alternatively, the duty cycle indicator signal may be provided to drive adjustment circuitry. In response to duty cycle not being within an acceptance range, drive adjust circuitry provides a drive adjustment signal to adjust duty cycle at an output buffer by turning on one or more p-channel drive transistors, one or more n-channel drive transistors, or a combination of both. Moreover, wells may be biased responsive to a detected duty cycle in order to correct the duty cycle.

38 Claims, 16 Drawing Sheets

DUTY CYCLE CHARACTERIZATION AND ADJUSTMENT

RELATED PATENT APPLICATION

One or more aspects of the present invention generally relate to U.S. Pat. No. 5,877,632 filed by Goetting et al. on Apr. 11, 1997 and issued Mar. 2, 1999, entitled "FPGA with a Plurality of I/O Voltage Levels", the contents of which are incorporated herein by reference.

FIELD OF THE INVENTION

Aspects of the present invention generally relate to duty cycle, and more particularly to characterization and adjustment of duty cycle.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, called a field programmable gate array (FPGA), is popular because of a superior combination of capacity, flexibility, time-to-market, and cost.

An FPGA typically includes an array of configurable logic blocks (CLBs) surrounded by a ring of programmable input/output blocks (IOBs). The CLBs and TOBs are interconnected by a programmable interconnect structure. The CLBs, TOBs, and interconnect structure are typically programmed by loading a stream of configuration data (bitstream) into internal configuration memory cells that define how the CLBs, IOBs, and interconnect structure are configured. The configuration bitstream may be read into an internal configuration memory from an external memory, conventionally an external integrated circuit memory EEPROM, EPROM, PROM, and the like, or directly loaded by a computer. The collective states of the internal memory cells then determine the function of the FPGA.

An important step in the manufacture of integrated circuits, such as CPLDS, FPGAs and the like, is testing these devices prior to shipment to a customer. However, chip handlers and testers are expensive, so chip designers have included test circuits on the devices (on the microchips) to reduce tester test time. This type of circuitry is conventionally known as "Built-In Self-Test" or "BIST". With respect to PLDs in particular, they comprise configurable logic which may be programmed to perform test functions. U.S. Pat. Nos. 5,790,479, 6,005,829, 6,069,849, 6,144,262, 6,219,305, 6,232,845, 6,233,205, 6,356,514, and 6,452,489 describe how such structures are programmed and tested, and are incorporated herein by reference.

However, some tests still need to be done by passing test signals directly through a tester, especially analog characterization. One such area is input/output (I/O) duty cycle. Device operation is dependent upon proper I/O transistor operation. However, accurate performance measurement of I/O transistor operation is problematic. This is partly due to insufficient tester speed to measure I/O switching speed under operative conditions ("dynamic behavior").

However, even with testers rated at very high operational speeds, accurate characterization of I/O transistor operation is elusive. Conventionally, parameters of I/O transistors are measured in a laboratory on a few sample chips to determine theoretical performance, which is then correlated with test data obtained from a tester on production chips. But it can take many hours of engineer and technician time to characterize and correlate less than ten microchips for just a few I/O's on each chip.

Though I/O transistors for each I/O on a chip are conventionally all made with the same semiconductor n-type and p-type processes, differences among I/O transistors on a chip may exist. If duty cycle of an I/O is not within acceptable parameters, this can lead to catastrophic failure.

Accordingly, it would be desirable and useful to be able to accurately characterize dynamic behavior of I/O transistors that was less costly than previous approaches. Moreover, it would be desirable and useful if dynamic behavior information for I/O transistor operation could be used to shift operation away from parameters that cause failure, and, for more rigorous applications, limit duty cycle.

SUMMARY OF THE INVENTION

An aspect of the present invention is a method for on-chip testing of duty cycle at an input/output node. A test signal having a non-zero frequency is generated. A duty cycle for the test signal is also generated. At least a portion of the test signal is obtained at the input/output node. The duty cycle is checked to determine the proportion at the input/output node.

An aspect of the present invention is an apparatus for on-chip testing of an n-type to p-type transistor threshold voltage ratio for a bi-directional input/output (I/O) block. An oscillator is configured to generate a waveform, and a divide-by circuit is coupled to receive the waveform to provide a duty cycle for the waveform. The bi-directional I/O block includes an input buffer and an output buffer, where the bi-directional I/O block is coupled to receive the waveform at the input buffer and to sample the waveform with the output buffer. A phase comparator circuit is coupled to the output buffer to receive the waveform sample and configured to generate a phase-shifted waveform sample and to provide an indication of whether the n-type to p-type transistor threshold voltage ratio of the bi-directional I/O block is balanced.

An aspect of the present invention is an apparatus for built-in self-testing of n-type to p-type transistor threshold voltage ratio for a bi-directional input/output (I/O) block of a programmable logic device. An oscillator is configured to generate a test signal, and a divide-by circuit coupled to receive the test signal and configured to provide a duty cycle for the test signal. The bi-directional I/O block includes complementary-metal-oxide-semiconductor (CMOS) input and output buffers coupled to receive the test signal and programmed to provide the test signal as an output and to sample the output. Counters are coupled to receive the output to count ones and zeros of the output, and a sample clock signal is provided to the counters. The sample clock signal is synchronized to the test signal and has a frequency in excess of that of the test signal. Compare logic is configured to receive outputs from the counters to determine the n-type to p-type transistor threshold voltage ratio.

An aspect of the present invention is a method for adjusting a duty cycle. A duty cycle indicator signal is provided to indicate duty cycle of an output signal. At least one transistor of a plurality of n-channel and p-channel transistors is turned on in response to the duty cycle indicator signal to adjust the duty cycle of the output signal. To increase the pull down strength while driving a logic 0 signal, an n-channel transistor is turned on. To increase the pull up strength while driving a logic 1 signal, a p-channel transistor is turned on. To accomplish this, the select terminals of these optional n-and p-channel transistors are controlled by a two-input AND gate in which one input to the AND gate is the data signal and the other input is the drive strength control.

Another aspect of the present invention is a duty cycle adjust system. Drive adjust circuitry is coupled to receive a duty cycle adjust enable signal and configured to provide a drive adjust address signal in response to the duty cycle adjust enable signal. A reference voltage generator is coupled to receive the drive adjust address signal and configured to provide a plurality of reference voltages in response to the drive adjust address signal. An output buffer is coupled to receive the plurality of reference voltages and configured to enable at least one p-channel drive transistor and at least one n-channel drive transistor in response to the plurality of reference voltages so that the enabled transistors can respond to an input signal. The output buffer is configured to sample an output signal to provide an output signal sample. Duty cycle check circuitry is coupled to receive the output signal sample and configured to provide a duty cycle indicator signal in response to the output signal sample. The output signal sample has a duty cycle responsive to the plurality of reference voltages. The drive adjust circuitry is coupled to receive the duty cycle indicator signal and configured to provide another drive adjust address signal in response to the duty cycle indicator signal.

Another aspect of the present invention is a method for adjusting transistor drive. A duty cycle for a signal is determined, where the duty cycle is at least partially responsive to at least one n-channel and p-channel transistor is used for propagating the signal. Drive voltage on at least one of the at least one n-channel and p-channel transistors is adjusted in response to the duty cycle determined.

DETAILED DESCRIPTION OF THE DRAWINGS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
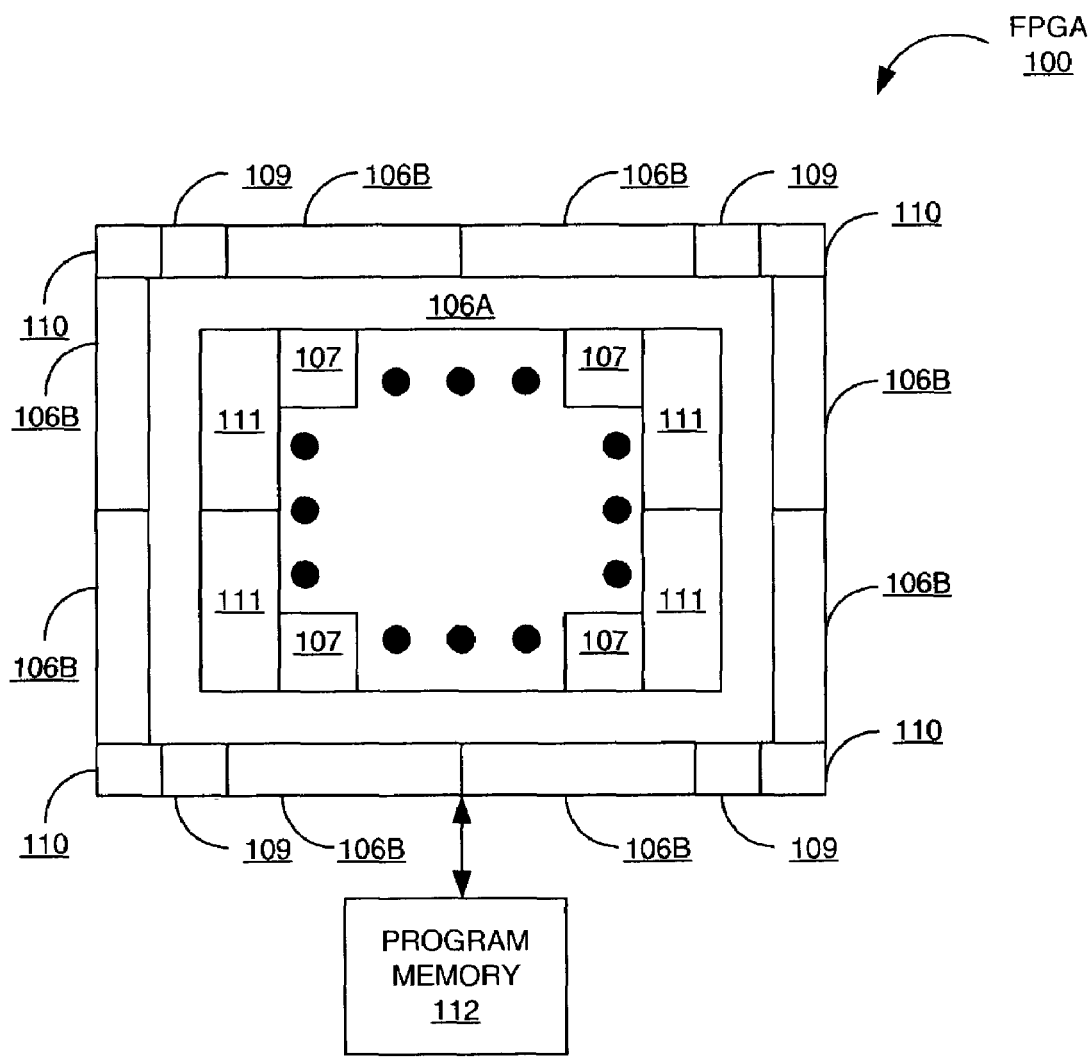
FIG. 1 is a block diagram of an exemplary embodiment of an FPGA in accordance of one or more aspects of the present invention coupled to program memory.
Figure 2:
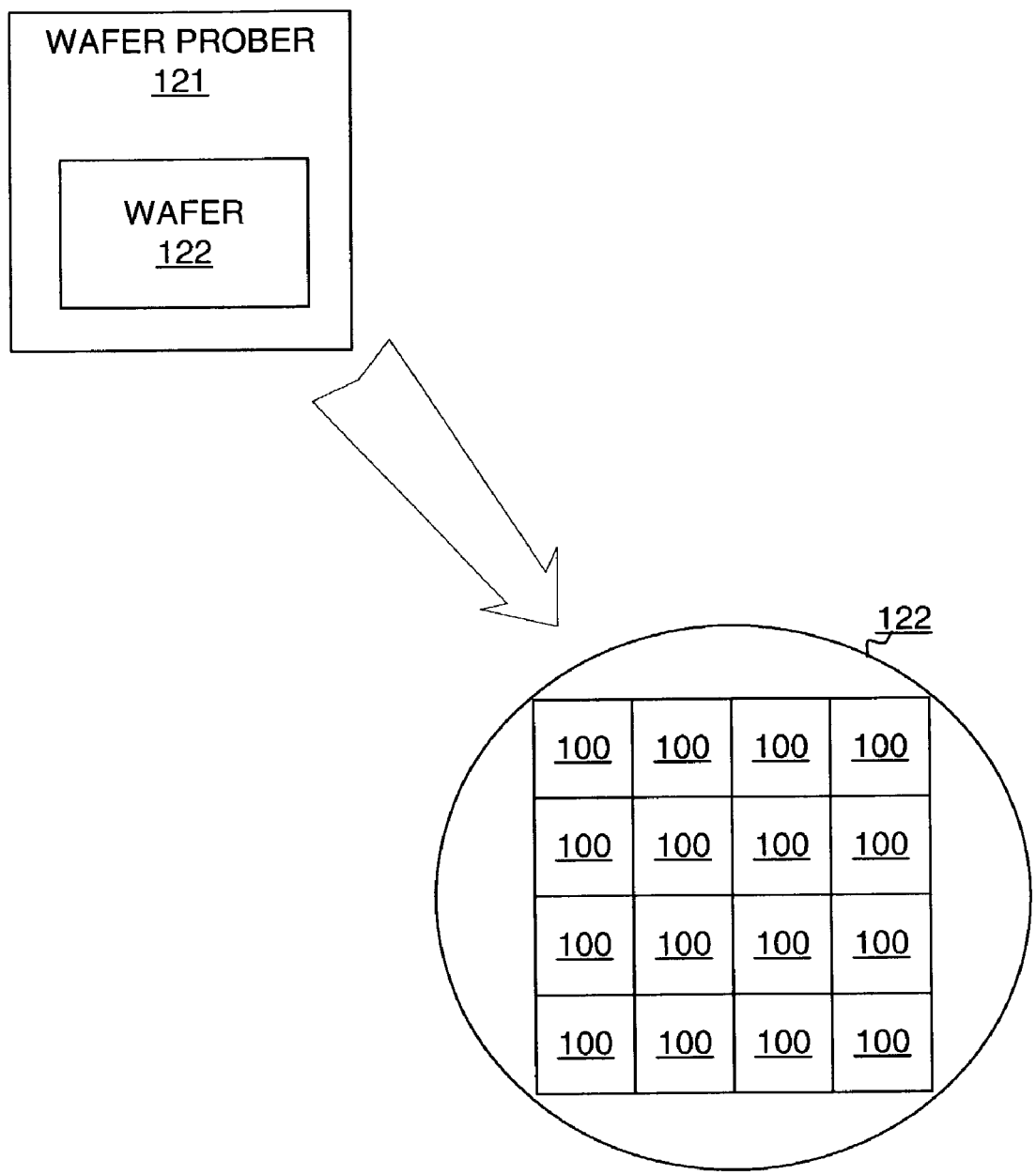
FIG. 2 is a block diagram of an exemplary embodiment of a wafer prober and wafer in accordance with one or more aspects of the present invention.

FIG. 1 is a block diagram of an exemplary embodiment of an FPGA 100 in accordance of one or more aspects of the present invention coupled to program memory 112. Program memory 112 is programmed for putting FPGA 100 into a test mode, described below in more detail. Alternatively, programming instruction to put FPGA 100 into a test mode may be provided via a wafer prober 121, as shown in FIG. 2. FPGA 100 comprises CLBs 107, I/O routing ring 106A, memory, such as random access memory 111, delay lock loops (DLLs) 109, multiply/divide/de-skew clock circuits 110, and programmable IOBs 106B. DLLs 109 and clock circuits 110 collectively provide digital clock managers (DCMs). As described below in more detail, one or more IOBs 106B may be programmed to sample an output provided from FPGA 100.

FIG. 2 is a block diagram of an exemplary embodiment of a wafer prober 121 having wafer 122 in accordance with one or more aspects of the present invention. Wafer 122 may comprise a plurality of FPGAs 100 at a stage of manufacture, such as prior to packaging. Prior to packaging FPGA 100, there may be one or more pads accessible for probing FPGA 100. These pads may or may not be accessible via I/O pins after packaging FPGA 100. Wafer prober 121 is used to put in FPGA 100 of wafer 122 into a test mode for a BIST of such a device.

Figure 3A:
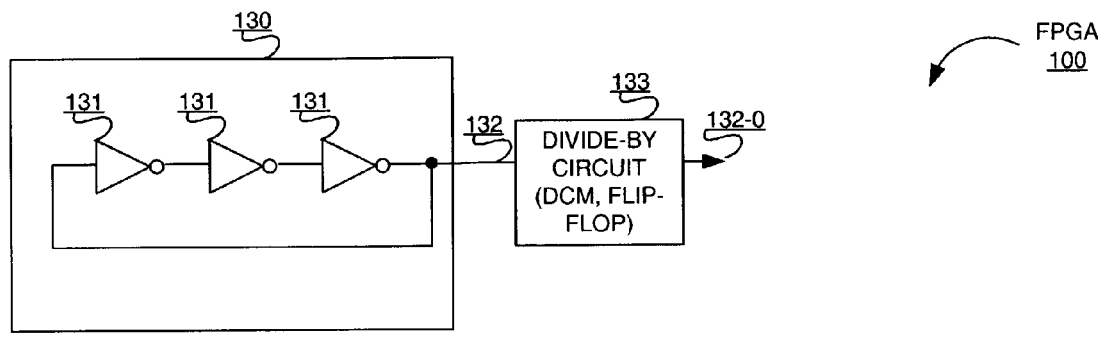
FIGS. 3A and 3B are block diagrams of respective portions of an exemplary FPGA configured for a duty cycle check test mode in accordance with one or more aspects of the present invention.

FIG. 3A is a block diagram of a portion of an exemplary embodiment of FPGA 100 configured for a duty cycle check test mode in accordance with one or more aspects of the present invention. Oscillator 130, which may be a ring oscillator as indicated by inverters 131 in a loop configuration, provides a waveform signal 132 having a non-zero frequency to a divide-by circuit 133. Through a three stage ring oscillator is shown, more stages may be used. Furthermore, oscillator 130 may be any external ("off-chip") clock signal source, such as a crystal oscillator, to FPGA 100, or any internal ("on-chip") clock signal source, such as a ring oscillator, of FPGA 100. Divide-by circuit 133 may be implemented with a flip-flop or a DCM. Divide-by circuit 133 provides waveform signal 132 output with a duty cycle, namely test signal 132-0.

Figure 3B:
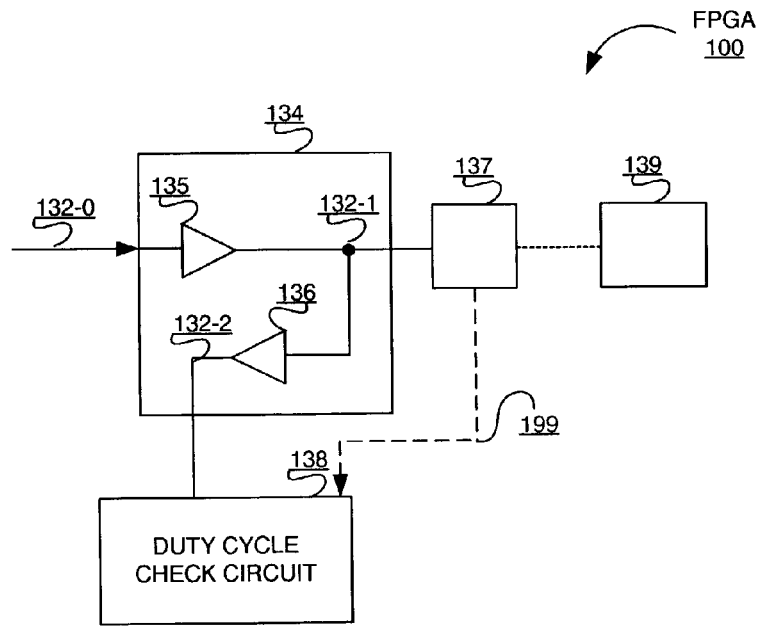

FIG. 3B is a block diagram of another portion of the exemplary embodiment of FPGA 100 of FIG. 3A. Test signal 132-0 is provided to IOB 134. IOB 134 is a bi-directional I/O device. An implementation of IOB 134, buffers 135 and 136 are coupled in series. Input buffer 135 receives test signal 132-0 and provides test signal 132-1. Output test signal 132-1 is provided as input to output buffer 136, which in turn outputs test signal 132-2.

With continuing reference to FIG. 3B and renewed reference to FIG. 3A, if divide-by circuit 133 is a divide-by-two circuit then a fifty-fifty duty cycle is created for test signal 132-0. Continuing the example of a fifty-fifty duty cycle, this duty cycle will be subject to accuracy of divide-by circuit 133. In a DCM embodiment it is currently possible to obtain a fifty-fifty duty cycle within approximately plus or minus twenty-five to fifty picoseconds. Notably, a flip-flop may be used to create a fifty-fifty duty cycle within approximately plus or minus fifty picoseconds as well. However, for purposes of clarity, it will be assumed that a DCM embodiment for divide-by-circuit 133 is used for purposes of this description having a correction granularity of one tap equivalent to approximately fifty picoseconds.

Input buffer 135 is used to output test signal 132-1 to pad 137. Again, pad 137 may be a used pad, and thus accessible for example by a pin 199 after packaging of FPGA 100, or it may be an unused pad, namely a pad which is not readily accessible by I/O pin after packaging FPGA 100.

Test signal 132-1 may have a duty cycle which is no longer fifty-fifty within approximately plus or minus 50 picoseconds. This is because threshold voltages for n-type and/or p-type transistors used in formation of complementary-metal-oxide-semiconductor (CMOS) input buffer 135 may not be within minimum and maximum design limits. Ratio of n-type to p-type threshold voltage is conventionally specified to provide a fifty-fifty duty cycle for an output driver 135 of an IOB 134. Access to signal 132-1 may be via pad 137, as indicated with respect to path 199, or via output 132-2 of output buffer 136. Conventionally output buffer 136 is made using the same CMOS process as input buffer 135. Thus, any change in duty cycle from test signal 132-0 to test signals 132-1 and 132-2 caused by IOB 134 are provided by duty cycle check circuit 138. Whether test signal 132-1 is monitored from pad 137 or test signal 132-2 is monitored from output buffer 136, in either embodiment such signal is going to be provided to duty cycle check circuit 138.

Figure 4A:
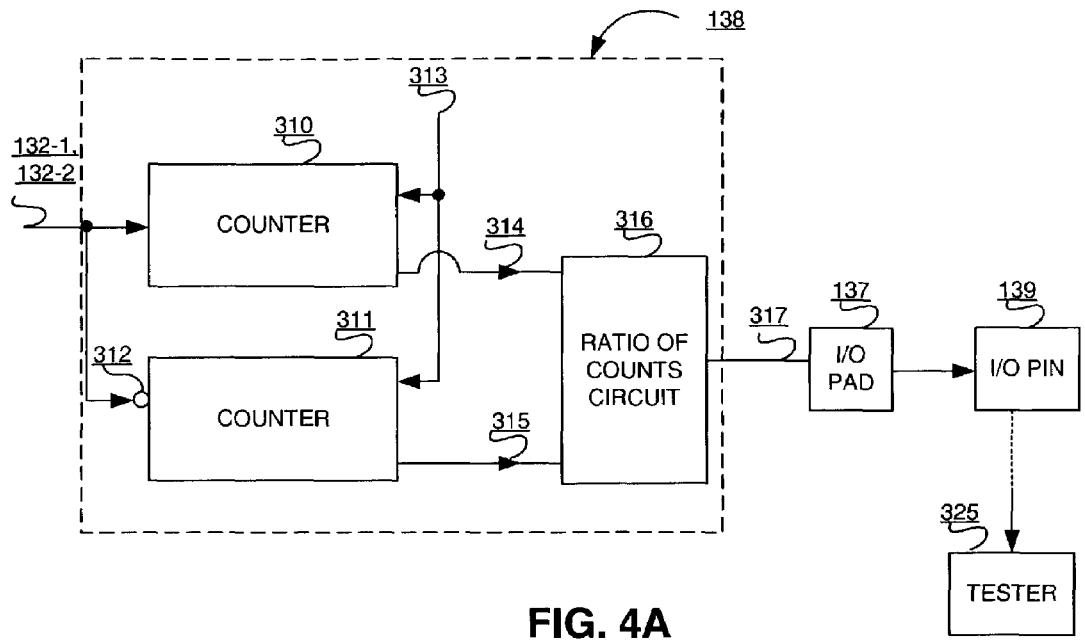
FIGS. 4A and 4B are block diagrams of respective exemplary embodiments of duty-cycle check circuits in accordance with one or more aspects of the present invention.
Figure 4B:
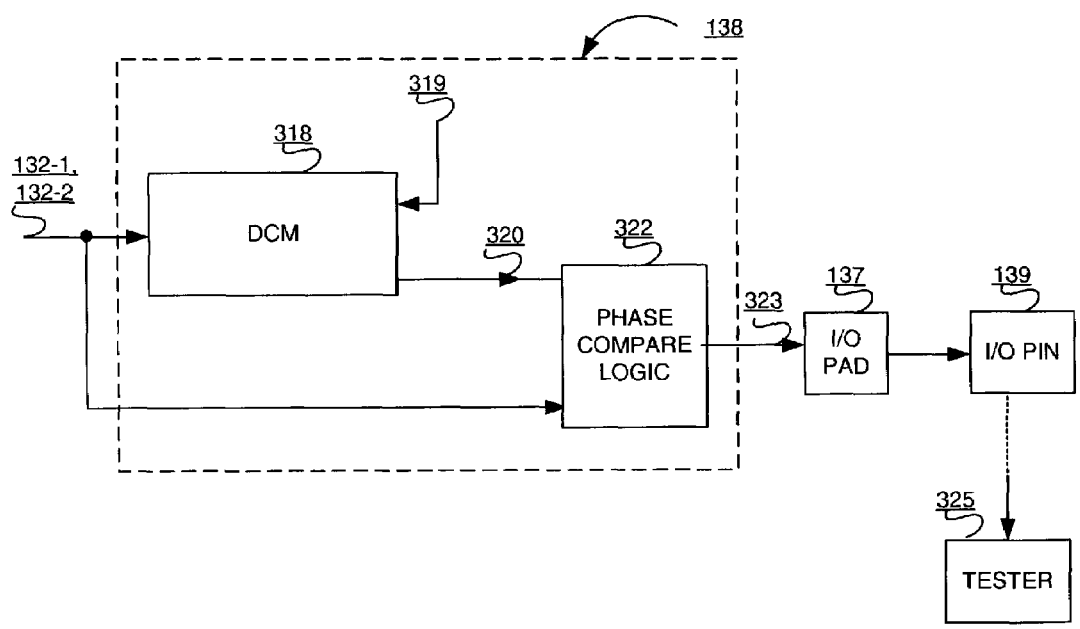

FIGS. 4A and 4B are block diagrams of respective exemplary embodiments of duty-cycle check circuit 138 in accordance with one or more aspects of the present invention. Input signal 132-1 or 132-2 is provided to counter 310. An inverter 312 is used to complement such input signals provided to counter 311. A sample clock 313 is provided to counters 310 and 311 for sampling test signal 132-1 or 132-2, and its respective complement. Sample clock signal 313 is higher in frequency than frequency of test signal 132-1 and 132-2. For purposes of example, it shall be assumed that frequency of a test signal is approximately 100 megahertz and frequency of sample clock is approximately 500 megahertz.

Sample clock signal 313 is synchronized to an oscillator, namely oscillator 130 of FIG. 3A for sampling counters 310 and 311. In this manner, counter 310 will count a one if a logic high, for example, is sampled for signal 132-1 or 132-2, and counter 311 will count a one if a logic low, for example, is sampled for signal 132-1 or 132-2. Logic high-count output 314 and logic low count output 315 are provided to ratio of counts circuit 316. Ratio of counts circuit 316 provides ratio output 317. The ratio of counts, namely ratio output 317, indicates duty cycle of a sampled test input signal. Thus, if duty cycle is or is not within a predetermined known minimum and maximum, duty cycle ratio signal 317 will provide an indication.

In order for counting highs and lows to be effective, sampling must be sufficiently long since a statistically sufficient count is to be obtained. Reliance on statistical sampling may take some time to obtain such a statistically sufficient number of samples, so a more timely embodiment may be employed.

FIG. 4B is a block diagram of an alternate embodiment of duty cycle check circuit 138 in accordance with one or more aspects of the present invention. Test input signal 132-1 or 132-2 is provided to a DCM 318 of FPGA 100. DCM 318 is configured to provide a phase adjusted output signal 320 for test input signal 132-1 or 132-2, respectively. This phase adjusted output signal is set to be at approximately 180° with respect to a test input signal.

A variable phase shift signal 319 is provided to DCM 318 to adjust phase relationship of phase adjusted signal 320 to input test signal 132-1 or 132-2, respectively, such that there is approximately a 180° phase separation between such two signals. Phase adjusted signal 320 and test signal 132-1 or 132-2, respectively, are provided to phase compare logic 322. Phase compare logic 322 compares the relevant phase of such two input signals to provide phase relationship output signal 323.

In the event that duty cycle is no longer fifty-fifty with respect to an input test signal, phase relationship signal 323 will indicate as much as phase adjusted signal 320 will not be 180° out of phase with respect to such an input test signal. Thus, phase relationship signal 323 may be used to provide adjustment to variable phase shift signal 319, namely to adjust phase such that edges line up by selecting fewer or more taps such as on a DLL, as described below in more detail.

Depending on the number of taps needed to adjust for phase difference such that signal 320 is 180° out of phase with respect to signal 132-1 or 132-2, provides an indicator as to the amount that duty cycle has been unwontedly shifted, if at all, from signal 132-0. For example, if there were 256 intervals to divide a period, namely, taps zero to 255, then a signal may be divided into such increments. Thus, for a particular range of acceptable duty cycles, a tap of a corresponding selection of taps may be selected to determine to produce a phase adjust signal 320 180° out of phase with test signal 132-1 or 132-2. If signal 319 cycled through taps such that no tap, for example, no tap of taps 126 through 130, produced an acceptable result, then it could be determined that duty cycle had been shifted to a degree causing failure of a part, or needing adjustment, as described below in more detail. Signals 314, 315 of FIG. 4A or signals 320, 132-1 or 132-2 of FIG. 4B, may be provided to a wafer probe to produce signals 317 or 323, respectively. However, as a PLD may be programmed for functions of blocks 316 or 322, fewer instructions need to be provided to such a wafer prober. This is important as wafer probers conventionally have less bandwidth than that afforded by PLDs. Moreover, if signal 317 or 323 is coupled to an I/O pin 139 then a test system or tester 325 may be used to check duty cycle. Thus, signals 317 and 323 may be used to indicate whether a device passes or fails for duty cycle. For example, if after subtracting signal 320 from signal 132-1 or 132-2, the resulting difference was or was not within acceptable limits could be determined with a tester or prober from signal 323.

Figure 5:
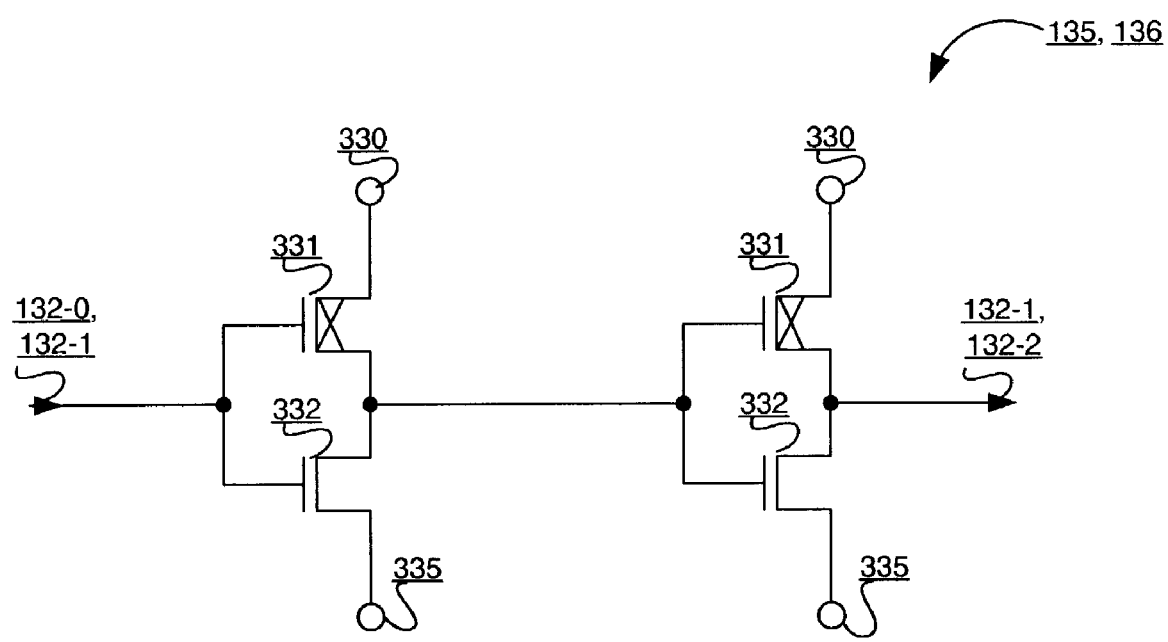
FIG. 5 is a schematic diagram of an exemplary embodiment of a buffer coupled to receive a test signal in accordance with or more aspects of the present invention.

FIG. 5 is a schematic diagram of an exemplary embodiment of a buffer, such as buffer 135 and 136, receiving a test signal 132-0 or 132-1, in accordance with or more aspects of the present invention. As indicated, two inverters are in series to provide a buffer 135, 136, where terminal 330 is connected to Vdd and terminal 335 is connected to Vss. In this CMOS configuration, p-type transistors 331 are respectively coupled with n-type transistors 332 in a well-known manner.

IOB with DCI

Figure 6:
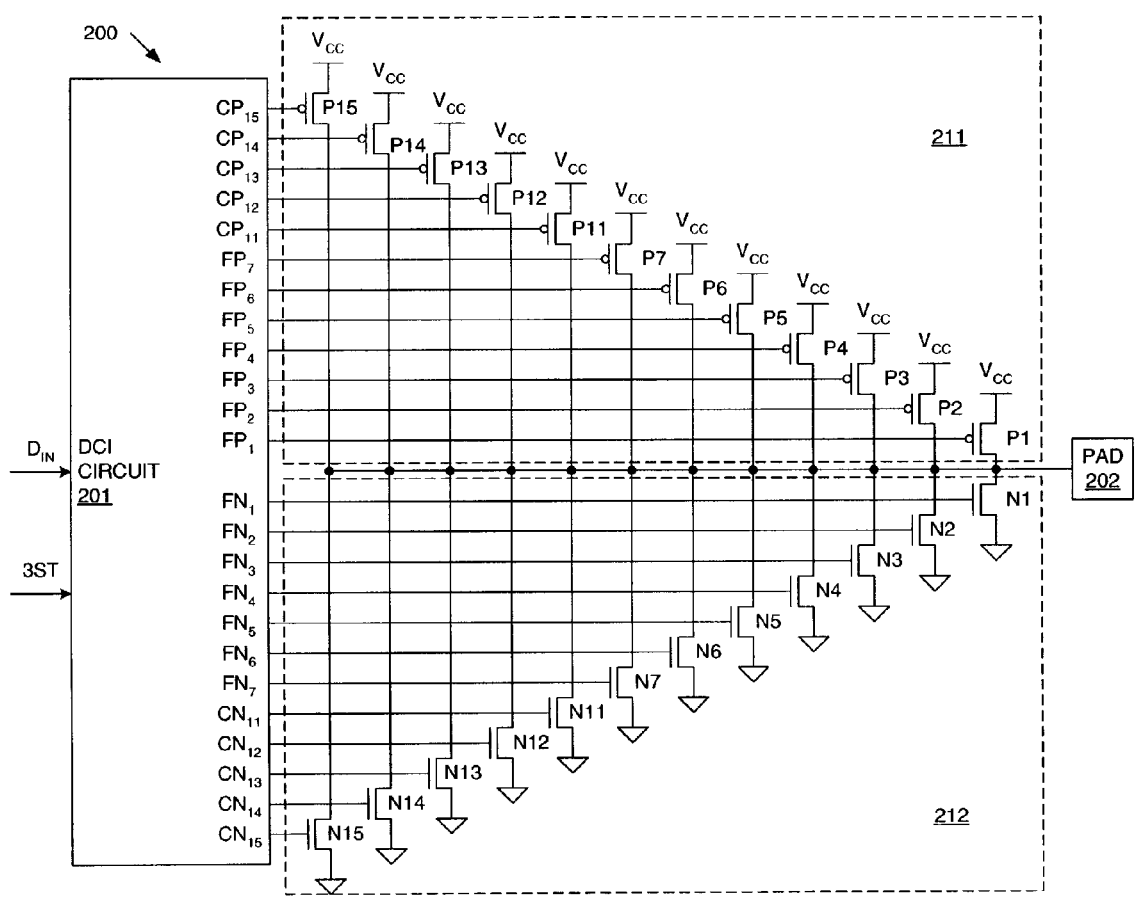
FIG. 6 is a circuit diagram of an output driver circuit.

FIG. 6 is a circuit diagram of an output driver 200. Output driver 200 includes digitally controlled impedance (DCI) circuit 201, p-channel pull-up transistors P1–P7 and P11–P15, n-channel pull-down transistors N1–N7 and N11–N15, and I/O pad 202. P-channel pull-up transistors P1–P7 and P11–P15 are collectively referred to as p-channel transistors 211, and n-channel pull-down transistors N1–N7 and N11–N15 are collectively referred to as n-channel transistors 212. In other embodiments, other combinations of transistors can be used.

As described in more detail below, p-channel transistors P1–P7 are used as "fine-adjustment" transistors, each having an on-conductance of "$Y_P$" siemens. Similarly, n-channel transistors N1–N7 are used as "fine-adjustment" transistors, each having an on-conductance of "$Y_N$" siemens. P-channel transistors P11–P15 are used as "coarse-adjustment" transistors, having on-conductances of $1X_P$, $2X_P$, $4X_P$, $8X_P$ and $16X_P$ siemens, respectively. N-channel transistors N11–N15 are also used as "coarse-adjustment" transistors, having on-conductances of $1X_N$, $2X_N$, $4X_N$, $8X_N$ and $16X_N$ siemens, respectively. In the described embodiment, $Y_P$ is approximately equal to $X_P$, and $Y_N$ is approximately equal to $X_N/2$. In other embodiments, other conductance values can be used.

Each of fine p-channel transistors P1–P7 and coarse p-channel transistors P11–P15 has a source coupled to a $V_{cc}$ voltage supply terminal. Each of fine n-channel transistors N1–N7 and coarse n-channel transistors N11–N15 has a source coupled to a ground voltage supply terminal. The drains of transistors P1–P7, P11–P15, N1–N7 and N11–N15 are coupled to I/O pad 202.

The gates of fine p-channel transistors P1–P7 are coupled to receive control signals $FP_1$–$FP_7$, respectively, from DCI circuit 201. Similarly, the gates of coarse p-channel transistors P11–P15 are coupled to receive control signals $CP_{11}$–$CP_{15}$, respectively, from DCI circuit 201.

The gates of fine n-channel transistors N1–N7 are coupled to receive control signals $FN_1$–$FN_7$, respectively, from DCI circuit 201. Similarly, the gates of coarse n-channel transistors N11–N15 are coupled to receive control signals $CN_{11}$–$CN_{15}$, respectively, from DCI circuit 201.

DCI circuit 201 is configured to receive a data input signal $D_{IN}$ and a tri-state signal 3ST, each having a logic high or logic low value. In general, if 3ST signal has a logic low value (i.e., driver 200 is not tri-stated) and the $D_{IN}$ signal has a logic low value, DCI circuit 201 asserts one or more of the control signals $FP_1$–$FP_7$, $CP_{11}$–$CP_{15}$ to a logic low value, thereby turning on one or more of p-channel transistors P1–P7, P11–P15. The turned on p-channel transistors are selected in a manner described in more detail below. DCI circuit 201 also provides logic low control signals $FN_1$–$FN_7$, $CN_{11}$–$CN_{15}$, thereby turning off all of n-channel transistors N1–N7 and N11–N15. As a result, pad 202 is coupled to the $V_{cc}$ voltage supply terminal through the turned-on p-channel transistors. DCI circuit 201 selects the turned-on p-channel transistors to provide a particular resistance between the $V_{cc}$ voltage supply terminal and pad 202.

If the 3ST signal has a logic high value, then output driver circuit 200 is tri-stated and will generally not drive pad 202. However, if output driver circuit 200 is used to provide a transmission line termination (as described in more detail below), then output driver circuit 200 will be configured to turn on a combination of n-channel and/or p-channel transistors to provide the appropriate transmission line termination resistance. In this case, the 3ST signal has no affect on the line termination.

In the examples described below, coarse p-channel transistors P11–P15 are enabled in a binary count order to provide a coarse resistance adjustment. Fine p-channel transistors P1–P7 are then enabled or disabled to provide a fine resistance adjustment. For example, fine p-channel transistors P1–P3 and coarse p-channel transistor P13 may be turned on when the $D_{IN}$ signal has a low value. In this example, the equivalent conductance of the p-channel portion of output driver circuit 200 would be equal to $X_P+X_P+X_P+4X_P$, or $7X_P$ siemens.

If 3ST signal has a logic low value and the $D_{IN}$ signal has a logic high value, then DCI circuit 201 asserts one or more of the control signals $FN_1$–$FN_7$, $CN_{11}$–$CN_{15}$ to a logic high value, thereby turning on one or more of n-channel transistors N1–N7, N11–N15. The turned on n-channel transistors are selected in a manner described in more detail below. DCI circuit 201 also provides logic high control signals $FP_1$–$FP_7$, $CP_{11}$–$CP_{15}$, thereby turning off all of p-channel transistors P1–P7 and P11–P15. As a result, pad 202 is coupled to the ground terminal through the turned-on n-channel transistors. DCI circuit 201 selects the turned-on n-channel transistors to provide a particular resistance between the ground terminal and pad 202.

In the examples described below, the coarse n-channel transistors N11–N15 are turned on in a binary count order to provide a coarse resistance adjustment. Fine n-channel transistors N1–N7 are then enabled or disabled to provide a fine resistance adjustment. For example, fine n-channel transistors N1–N2 and coarse n-channel transistors N11 and N14 may be turned on when the $D_{IN}$ signal has a high value. In this example, the equivalent conductance of the n-channel portion of output driver circuit 200 would be equal to $X_N/2+X_N/2+X_N+8X_N$, or $10X_N$ siemens.

A chip will include a plurality of output driver circuits identical to output driver circuit 200. In general, one output driver circuit is selected to be a p-channel reference circuit, which is used to determine which p-channel transistors must be turned on to provide a desired resistance for a logic high output value or a desired transmission line termination. Similarly, one output driver circuit is selected to be an n-channel reference circuit, which is used to determine which n-channel transistors must be turned on to provide a desired resistance for a logic low output value or a desired transmission line termination. The determinations made by the p-channel and n-channel reference circuits are then transmitted to, and used by, other active output driver circuits.

Figure 7:
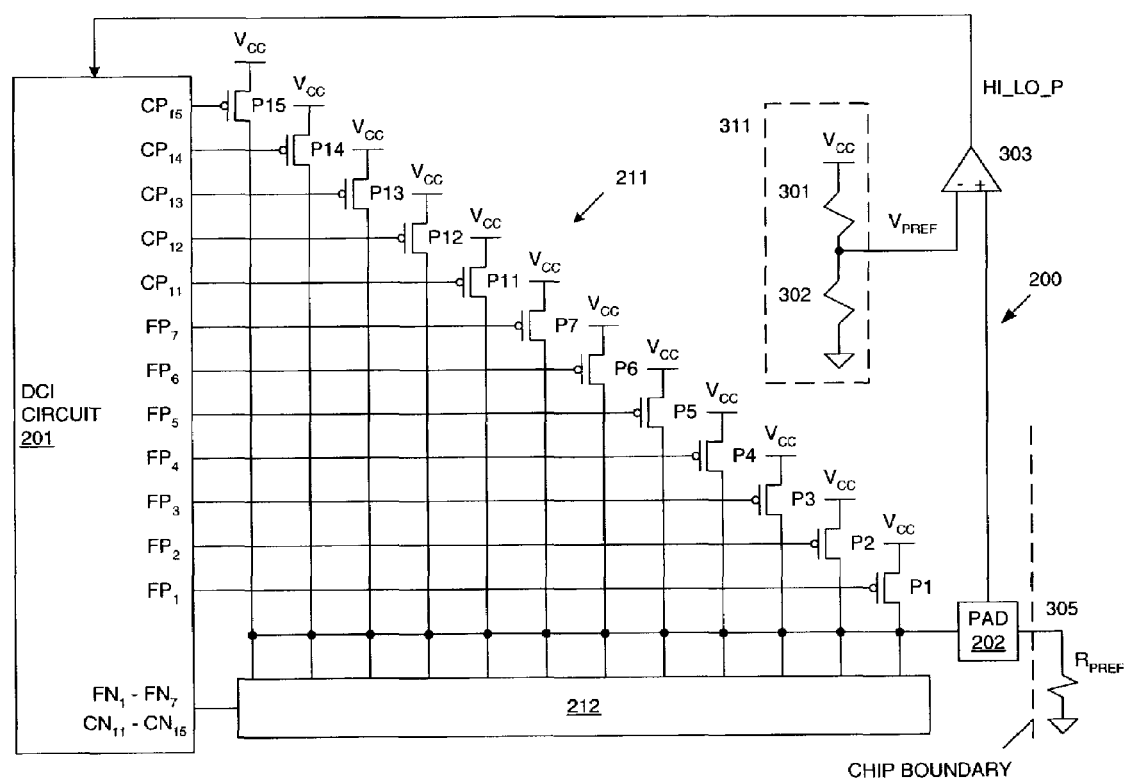
FIG. 7 is a circuit diagram illustrating the general manner in which p-channel transistors of an output driver circuit are matched with an external resistance.

FIG. 7 is a circuit diagram illustrating the general manner in which p-channel transistors P1–P7 and P11–P15 of output driver circuit 200 are controlled with respect to an external resistance 305. That is, FIG. 7 illustrates output driver circuit 200 being used as a p-channel reference circuit. As shown in FIG. 7, external resistor 305, having a resistance of $R_{PREF}$, is coupled between pad 202 and ground. Internally, pad 202 is also coupled to a positive input terminal of comparator 303. The negative input terminal of comparator 303 is coupled to receive a p-channel reference voltage $V_{PREF}$ from a reference voltage generator 311. In the described example, reference voltage generator 311 includes a pair of resistors 301–302 connected in series between the $V_{cc}$ voltage supply and the ground supply. Resistors 301–302 are connected at a common node, which provides the $V_{PREF}$ voltage. In the described example, resistors 301–302 each have a resistance of R ohms. As a result, the reference voltage $V_{PREF}$ has a value of approximately $V_{cc}/2$. The voltage on pad 202 will exhibit a voltage of approximately $V_{cc}/2$ when the equivalent on-resistance of the enabled p-channel transistors 211 is approximately equal to the resistance $R_{PREF}$ of reference resistor 305. In other examples, other resistance values and ratios can be used for resistors 301 and 302.

DCI circuit 201 operates as follows. Initially, all of the p-channel transistors P1–P7 and P11–P15 are turned off. As a result, the voltage on pad 202 is pulled down to a voltage less than the reference voltage $V_{PREF}$. As a result, comparator 303 provides a logic low HI_LO_P output signal.

DCI circuit 201 then asserts logic low control signals $FP_1$–$FP_3$, thereby turning on fine p-channel transistors P1–P3 ($3X_p$ siemens). If the equivalent resistance of fine p-channel transistors P1–P3 is greater than the resistance $R_{PREF}$, then the voltage on pad 202 will be less than the reference voltage $V_{PREF}$. As a result, comparator 303 will provide a logic low HI_LO_P output signal.

In response, DCI circuit 201 asserts a logic low control signal $CP_{11}$, thereby turning on coarse p-channel transistor P11, ($X_p$ siemens) (along with fine p-channel transistors P1–P3).

Note that fine p-channel transistors P1–P7 are set near the midpoint of their range by initially turning on three of these transistors P1–P3 while the coarse p-channel transistors are selected. This enables the fine p-channel transistors P1–P7 to maintain an appropriate operating range when the resistance needs to be increased or decreased.

If the equivalent resistance of fine p-channel transistors P1–P3 and coarse p-channel transistor P11 is still greater than the resistance $R_{PREF}$, then the voltage on pad 202 will still be less than the reference voltage $V_{PREF}$. As a result, comparator 303 will again provide a logic low HI_LO_P output signal. In response, DCI circuit 201 de-asserts coarse control signal $CP_{11}$ (high), and asserts coarse control signal $CP_{12}$ (low), thereby turning on coarse p-channel transistor P12 ($2X_p$ siemens) (along with fine p-channel transistors P1–P3).

If the equivalent resistance of fine p-channel transistors P1–P3 and coarse p-channel transistor P12 is still greater than the resistance $R_{PREF}$, then the voltage on pad 202 will still be less than the reference voltage $V_{PREF}$. As a result, comparator 303 will again provide a logic low HI_LO_P output signal. In response, DCI circuit 201 asserts both coarse control signals $CP_{11}$ and $CP_{12}$ (low), thereby turning on coarse p-channel transistors P11–P12 ($3X_p$ siemens) (along with fine p-channel transistors P1–P3).

This sequence continues, with coarse p-channel transistors P11–P15 being turned on in a binary count order (e.g., $1X_p$, $2X_p$, $3X_p$, $4X_p$, $5X_p$, $6X_p$. . .) until the equivalent resistance of fine p-channel transistors P1–P3 and the enabled coarse p-channel transistors is less than the reference resistance $R_{PREF}$. At this time, the voltage on pad 202 will be greater than reference voltage $V_{PREF}$, thereby providing a logic high HI_LO_P signal. In response, DCI circuit 201 returns the coarse p-channel transistors to the binary count prior to the binary count that caused the HI_LO_P signal to go high.

For example, if the equivalent resistance of fine p-channel transistors P1–P3 and coarse p-channel transistors P12 and P13 ($6X_p$) is less than reference resistance $R_{PREF}$, then a logic high HI_LO_P signal will be generated. In response, DCI circuit 201 de-asserts control signal $CP_{12}$ (high), thereby turning off coarse p-channel transistor P12. DCI circuit 201 also asserts a logic low control signals $CP_{11}$ and $CP_{13}$, thereby turning on coarse p-channel transistors P11 and P13 ($5X_p$). Coarse p-channel transistors P11 and P13 are thereby selected to be the only turned-on coarse p-channel transistors for the duration of the present operating scheme. All further adjustments in the on-resistance of p-channel transistors 211 are made by enabling and disabling fine p-channel transistors P1–P7.

After the coarse adjustment described above, if coarse p-channel transistors P11 and P13 and fine p-channel transistors P1–P3 present an equivalent resistance that is greater than reference resistance $R_{PREF}$, comparator 303 again provides a logic low HI_LO_P signal to DCI circuit 201. Because the coarse transistors P11 and P13 have been set, DCI circuit 201 will only adjust the fine p-channel transistors at this time. Thus, DCI circuit 201 asserts the $FP_4$ control signal (in addition to the $FP_1$–$FP_3$, $CP_{11}$ and $CP_{13}$ signals), thereby turning on fine p-channel transistor P4 (in addition to fine p-channel transistors P1–P3 and coarse p-channel transistors P11 and P13). If the equivalent resistance of p-channel transistors P1–P4, P11 and P13 is less than reference resistance $R_{PREF}$, then comparator 303 will provide a high HI_LO_P signal. In response, DCI circuit 201 will subsequently turn off fine p-channel transistor P4.

If the equivalent resistance of fine p-channel transistors P1–P4 and coarse p-channel transistors P11 and P13 is greater than reference resistance $R_{PREF}$, then comparator 303 will again provide a low HI_LO_P output signal. In response, DCI circuit 201 will assert the $FP_5$ signal (in addition to the $FP_1$–$FP_4$, $CP_{11}$ and $CP_{13}$ signals), thereby turning on fine p-channel transistor P5 (in addition to fine p-channel transistors P1–P4 and coarse p-channel transistors P11 and P13). If the equivalent resistance of p-channel transistors P1–P5, P11 and P13 is less than (or greater than) reference resistance $R_{PREF}$, then comparator 303 will provide a high (or low) HI_LO_P output signal. Operation continues in this manner, with the fine p-channel transistors being adjusted as required. As a result, the equivalent resistance of the turned on p-channel transistors will have a predetermined relationship with respect to the reference resistance $R_{PREF}$. Advantageously, the number of turned on p-channel transistors will be further modified in response to the operating conditions of the system (e.g., changes in temperature and/or voltage) to maintain the equivalent resistance.

As described in more detail below, information identifying the enabled transistors in the p-channel reference circuit (FIG. 7) is transmitted to other output driver circuits, such that these other output driver circuits are operated by enabling the same transistors as the p-channel reference circuit.

Figure 8:
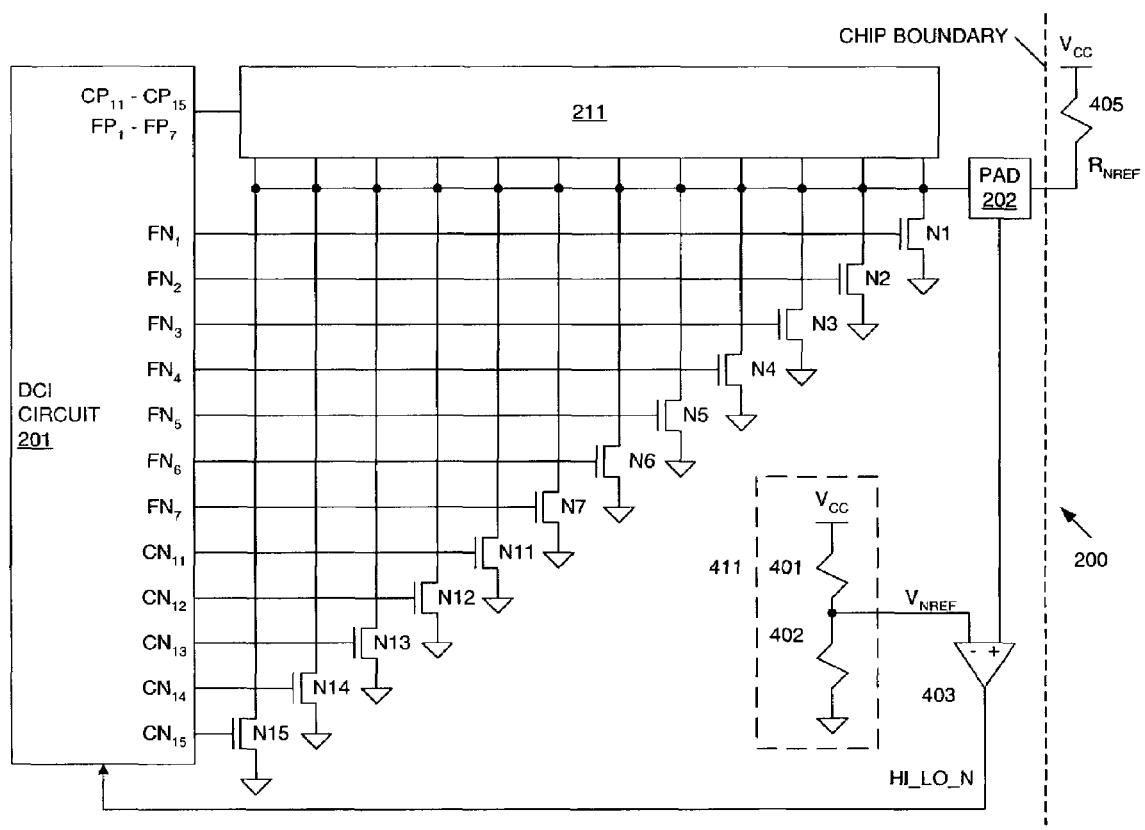
FIG. 8 is a circuit diagram illustrating the general manner in which n-channel transistors of an output driver circuit are matched with an external resistance.

FIG. 8 is a circuit diagram illustrating the general manner in which n-channel transistors N1–N7 and N11–N15 of output driver circuit 200 are matched with an external resistance 405. That is, FIG. 8 illustrates output driver circuit 200 being used as an n-channel reference circuit. As shown in FIG. 8, external resistor 405, having a resistance of $R_{NREF}$, is coupled between pad 202 and the $V_{cc}$ supply terminal. Internally, pad 202 is also coupled to the positive input terminal of comparator 403. The negative input terminal of comparator 403 is coupled to receive a reference voltage $V_{NREF}$ from a reference voltage generator 411. In the described example, reference voltage generator 411 includes a pair of resistors 401–402 connected in series between the $V_{cc}$ supply terminal and the ground terminal. Resistors 401–402 are connected at a common node, which provides the $V_{NREF}$ voltage. In the described example, resistors 401–402 each have a resistance of R ohms. As a result, the reference voltage $V_{NREF}$ has a value of approximately $V_{cc}/2$. The voltage on pad 202 will exhibit a voltage of approximately $V_{cc}/2$ when the resistance provided by the turned on n-channel transistors is approximately equal to the resistance $R_{NREF}$ of reference resistor 405.

DCI circuit 201 selects the n-channel transistors to be enabled in the same manner that the p-channel transistors are selected, as described above in connection with FIG. 7. Thus, all of the n-channel transistors N1–N7 and N11–N15 are initially turned off by DCI circuit 201. Fine n-channel transistors N1–N3 are then turned on by DCI circuit 201. If necessary, coarse n-channel transistors N11–N15 are turned on in a binary count order until comparator 403 provides a logic low HI_LO_N output signal. Upon detecting the logic low HI_LO_N output signal, DCI circuit 201 enables the coarse n-channel transistors corresponding with the previous binary count, and makes all further adjustments using the fine n-channel transistors N1–N7.

As described in more detail below, information identifying the enabled transistors in the n-channel reference circuit (FIG. 8) is transmitted to other output driver circuits, such that these other output driver circuits are operated by enabling the same transistors as the n-channel reference circuit. As a result, the output driver circuits will be referenced to external reference resistances. This advantageously optimizes the operation of the output driver circuits.

In another embodiment, instead of the linear search algorithm described above, a binary search algorithm can be used to determine the P or N channel transistors to be turned on.

In accordance with one embodiment, adjustments made by DCI circuit 201 can be dynamically enabled or disabled. For example, after DCI circuit 201 has determined which coarse and fine p-channel transistors should be turned on, and which coarse and fine n-channel transistors should be turned on, DCI circuit 201 can be prevented from making further changes to the enabled/disabled transistors. Thus, if DCI circuit 201 initially determines that p-channel transistors P1–P3, P13 and P15 should be turned on, then further adjustments by DCI circuit 201 can be disabled, thereby causing this p-channel determination to be used, without change, until the DCI circuit 201 is re-enabled.

In the embodiment described above, both of the reference voltages $V_{PREF}$ and $V_{NREF}$ have a value of approximately $V_{cc}/2$, thereby causing the p-channel transistors to be referenced to reference resistance 305 ($R_{PREF}$) and the n-channel transistors to be referenced to reference resistance 405 ($R_{NREF}$). In another embodiment, the reference voltages $V_{PREF}$ and $V_{NREF}$ can be modified to have values of approximately $2V_{cc}/3$ and $V_{cc}/3$, respectively. This effectively references the p-channel transistors to ½ of the reference resistance 305 ($R_{PREF}$), and references the n-channel transistors to ½ of the reference resistance 405 ($R_{NREF}$). In other embodiments, the reference voltages $V_{PREF}$ and $V_{NREF}$ can be modified to have other values, such that the turned on transistors will have different relationships with respect to the reference resistors 305 and 405. This advantageously allows reference resistors having different values to be used.

In another embodiment, external reference resistor 405 can be eliminated. In this embodiment, the reference resistance for the n-channel reference circuit is provided by turning on the p-channel transistors 211 determined by the p-channel reference circuit in response to reference resistor 305. Thus, if the p-channel reference circuit determines that coarse p-channel transistors P13 and P15 and fine p-channel transistors P1–P4 must be turned on to provide the desired correspondence with reference resistor 305, then these transistors P1–P4, P13 and P15 are turned on in the n-channel reference circuit. The n-channel reference circuit then determines which n-channel transistors 212 should be turned on to correspond with the turned on p-channel transistors in the output driver circuit. In this manner, the n-channel transistors 212 turned on by the n-channel reference circuit are indirectly referenced to the external reference resistance $R_{PREF}$ 305.

In a similar manner, external reference resistor 305 can be eliminated. In this embodiment, the n-channel reference circuit determines which n-channel transistors should be turned on in response to the external reference resistance 405 ($R_{NREF}$). This information is then transmitted to the p-channel reference circuit, such that the same n-channel transistors are turned on in the p-channel reference circuit. The p-channel reference circuit then determines which p-channel transistors should be turned on to correspond with the turned on n-channel transistors. In this manner, the p-channel transistors turned on by the p-channel reference circuit are indirectly referenced to the external reference resistance 405.

Figure 9A:
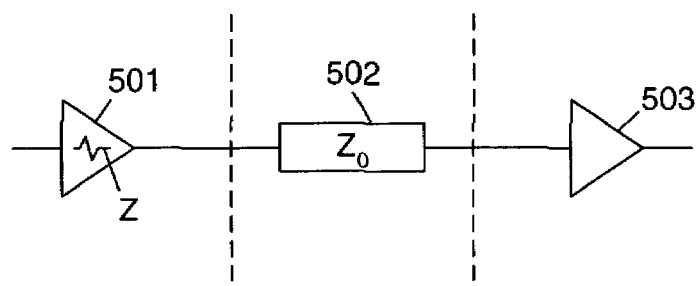
FIG. 9A is a circuit diagram illustrating a digitally controlled impedance (DCI) output driver circuit that has a digitally controlled impedance.

As described above, adjusting the p-channel and n-channel transistors to be enabled in an output driver circuit in response to reference resistances advantageously enables the output driver circuit to exhibit a particular resistance with respect to reference resistors. An output driver circuit that is adjusted in this manner will be referred to as a digitally controlled impedance (DCI) output driver circuit. FIG. 9A is a circuit diagram illustrating a DCI output driver circuit 501 that has a digitally controlled impedance Z. Impedance Z is selected to correspond with the impedance $Z_O$ of a line 502 located between the DCI driver circuit 501 and a receiver circuit 503.

Figure 9B:
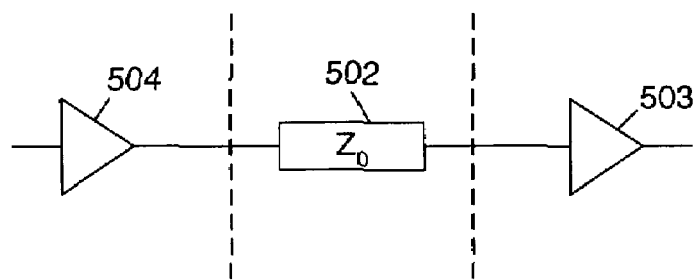
FIG. 9B is a circuit diagram illustrating an output driver circuit in which a DCI circuit has been bypassed.

In another embodiment, DCI circuit 201 is bypassed, such that some or all of the p-channel transistors 211 are turned on to provide a logic high output signal, and some or all of the n-channel transistors 212 are turned on to provide a logic low output signal. FIG. 9B is a circuit diagram illustrating an output driver circuit 504 in which DCI circuit 201 has been bypassed. Although output driver circuit 504 will exhibit an impedance, this impedance is not controlled to have a particular correspondence with the impedance $Z_O$ of line 502.

DCI circuit 201 can also be controlled to turn on user-selected p-channel transistors to provide a logic high output signal, and to turn on user-selected n-channel transistors to provide a logic low output signal. For example, DCI circuit 201 can be controlled to turn on only the coarse p-channel transistors P11–P15 to provide a logic high output signal, and to turn on only the coarse n-channel transistors N11–N15 to provide a logic low output signal, regardless of the external impedance $Z_O$. This alternative is described in more detail in commonly owned U.S. Pat. No. 5,877,632, which is hereby incorporated by reference.

Figure 10A:
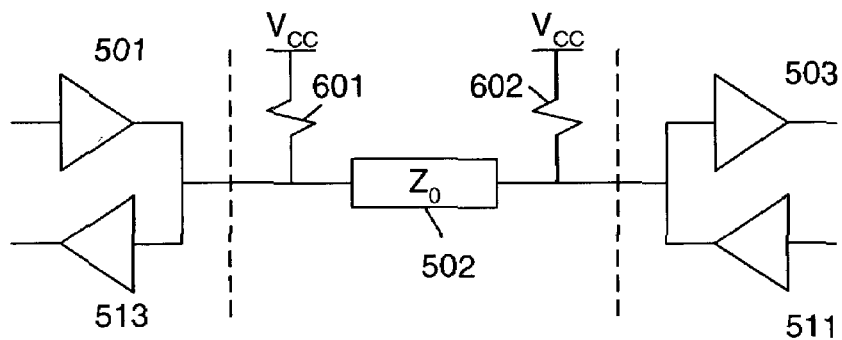
FIG. 10A is a circuit diagram illustrating external termination resistors, which are coupled between the ends of a line and a $V_{cc}$ supply voltage terminal.

In addition to controlling the turned on transistors of output driver circuit 200 to correspond with an external impedance $Z_O$, DCI circuit 201 can be controlled to provide a transmission line termination resistance. As illustrated in FIG. 10A, it is common to provide external termination resistors 601–602, which are coupled between the ends of line 502 and a $V_{cc}$ supply voltage terminal. In FIG. 10A, output driver circuit 501 is coupled to an input buffer 513 at one end of line 502, thereby providing an input/output I/O configuration. Similarly, input buffer 503 is coupled to output driver circuit 511 at the other end of line 502.

Figure 10B:
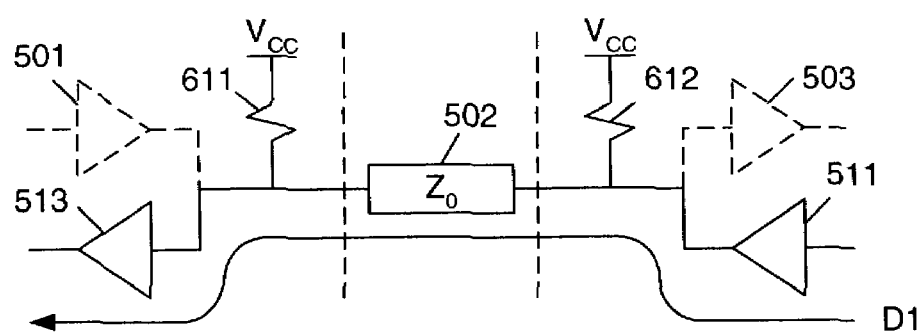
FIGS. 10B–10C are circuit diagrams illustrating termination resistors that are implemented using the digitally controlled impedances of output driver circuits, thereby eliminating the need for external termination resistors.
Figure 10C:
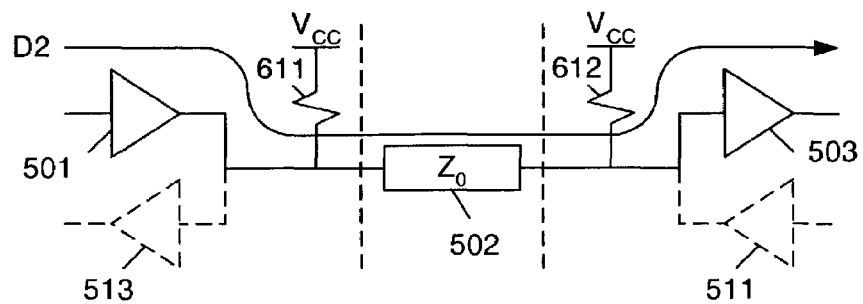

As illustrated in FIGS. 10B and 10C, termination resistors 611 and 612 can be implemented using the digitally controlled impedance of output driver circuits 501 and 511, respectively, thereby eliminating the need for external termination resistors 601 and 602. To determine the p-channel transistors to be turned on to implement termination resistors 611 and 612, the DCI circuits in output driver circuits 501 and 511 are referenced to a known resistance in response to reference voltages $V_{PREF}$ and $V_{NREF}$ having values of approximately $V_{cc}/2$ and $V_{cc}/2$, respectively. Advantageously, the termination resistance is controlled with respect to external reference resistors and can be adjusted for changes in temperature, voltage and/or process.

Within output driver circuits 501 and 511, a user-selected set of p-channel transistors is used to drive a logic high output signal. For example, the coarse p-channel transistors P11–P15 may be selected to drive a logic high output signal in response to a corresponding input data signal. In this example, a subset of the fine p-channel transistors P1–P7 is selected to provide the termination resistance. While the coarse p-channel transistors are only turned on to drive a logic high output signal, the selected subset of the fine p-channel transistors P1–P7 are turned on at all times to provide the desired termination resistance. In other embodiments, other combinations of coarse and fine transistors can be used to serve as the user-selected transistors and the termination transistors.

FIG. 10B illustrates a signal D1 being driven from output driver 511 to input buffer 513. At this time, output driver 511 is configured in manner described above. That is, output driver 511 provides logic high and low output signals by turning on user-selected transistors (e.g., all coarse p-channel transistors or all coarse n-channel transistors). In addition, a second set of p-channel transistors in driver circuit 511 are turned on to implement termination resistor 612. A tri-state signal applied to output driver circuit 501 is asserted, such that this output driver circuit 501 is not responsive to signals applied to its input terminal. However, the set of p-channel transistors in output driver circuit 501 that have been selected to implement termination resistor 611 remain turned on. As a result, the desired termination resistances 611 and 612 are provided between line 502 and the $V_{cc}$ supply terminal.

FIG. 10C illustrates a signal D2 being driven from output driver 501 to input buffer 503. At this time, output driver 501 is configured in the same manner as output driver circuit 511 of FIG. 10B, such that this output driver 501 provides logic high and low output signals by turning on user-selected transistors, and provides the termination resistor 611 by turning on the set of p-channel transistors that have been selected to implement this termination resistor. A tri-state signal applied to output driver circuit 511 is asserted, such that this output driver circuit 511 is not responsive to signals applied to its input terminal. However, the set of p-channel transistors in output driver circuit 511 that have been selected to implement termination resistor 612 remain turned on. As a result, the desired termination resistances 611 and 612 are provided between line 502 and the $V_{cc}$ supply terminal. In this manner, output driver circuits 501 and 511 provide termination resistances 611 and 612, respectively, for bi-directional signal transfer on line 502. The terminations illustrated in FIGS. 10B–10C are referred to as single terminations, because a single set of transistors is used to provide each termination.

Figure 11A:
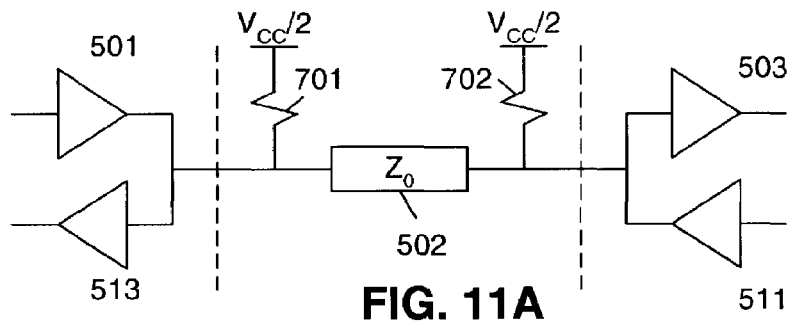
FIG. 11A is a circuit diagram illustrating external termination resistors, which are coupled between the ends of a line and a $V_{cc}/2$ supply voltage terminal.

As illustrated in FIG. 11A, it is also common to provide external termination resistors 701 and 702, which are coupled between the ends of line 502 and a $V_{cc}/2$ supply voltage terminal.

Figure 11B:
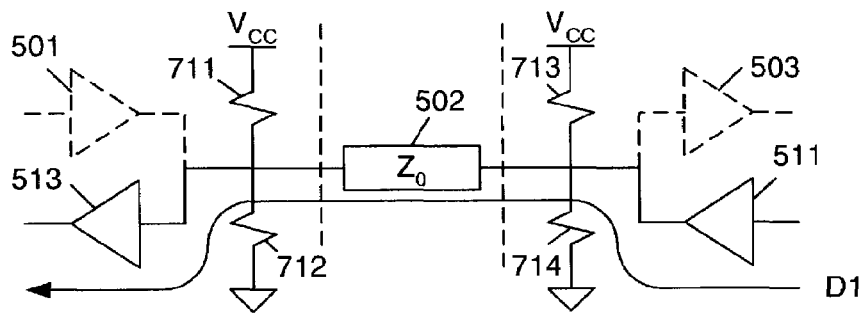
FIGS. 11B–11C are circuit diagrams of termination resistors that are implemented using the digitally controlled impedances of output driver circuits, thereby eliminating the need for external termination resistors and a $V_{cc}/2$ supply.
Figure 11C:
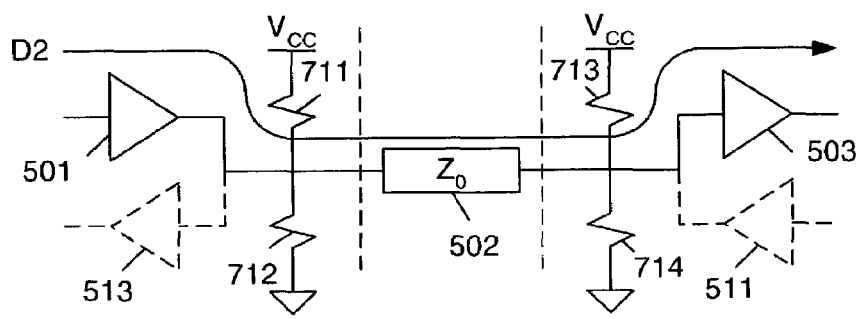

As illustrated in FIGS. 11B and 11C, termination resistors 711–712 and 713–714 can be implemented using the DCI circuits of driver circuits 501 and 511, respectively, thereby eliminating the need for external termination resistors 701 and 702 and the $V_{cc}/2$ power supply. Each of resistors 711–714 is determined to have a resistance that is equal to twice the resistance of resistor 701 (or 702). As a result, resistors 711–712 and 713–714 are the Thevenin equivalents of resistors 701 and 702, respectively.

To determine the p-channel and n-channel transistors to be turned on to implement termination resistors 711–714, the DCI circuits in output driver circuits 501 and 511 are referenced to known resistances in response to reference voltages $V_{PREF}$ and $V_{NREF}$ having values of approximately $2V_{cc}/5$ and $3V_{cc}/5$, respectively. Advantageously, impedance is controlled with respect to external reference resistors and can be adjusted for changes in temperature, voltage and/or process.

FIG. 11B illustrates a signal D1 being driven from output driver 511 to input buffer 513. At this time, output driver 511 is configured in the same manner as output driver circuit 511 of FIG. 10B, such that this output driver 511 provides logic high and low output signals by turning on user-selected transistors, and provides termination resistances 713 and 714 by turning on the p-channel and n-channel transistors that have been determined to provide these desired termination resistances 713 and 714. A tri-state signal applied to output driver circuit 501 is asserted, such that this output driver circuit 501 is not responsive to signals applied to its input terminal. However, the p-channel transistors and the n-channel transistors that have been determined to provide the desired termination resistances 711 and 712 remain turned on in output driver 501. As a result, output driver circuit 501 provides the equivalent of termination resistance 701 coupled between line 502 and a $V_{cc}/2$ supply terminal. Similarly, output driver circuit 511 provides the equivalent of termination resistance 702 between line 502 and a $V_{cc}/2$ supply terminal.

FIG. 11C illustrates a signal D2 being driven from output driver 501 to input buffer 503. At this time, output driver 501 is configured in the same manner as output driver circuit 511 of FIG. 11B, and output driver 511 is configured in the same manner as output driver circuit 501 of FIG. 11B. In this manner, output driver circuits 501 and 511 provide termination resistances 711–712 and 713–714, respectively, for bi-directional signal transfer on line 502. The terminations illustrated in FIGS. 11B–11C are referred to as split terminations, because two sets of transistors are required to provide each termination.

The variations illustrated in FIGS. 9A–9B, 10A–10C and 11A–11C, as well as the manner of transmitting information from the p-channel and n-channel reference circuits to other output driver circuits, will now be described in more detail. Other information about such circuits is provided in U.S. Pat. No. 6,445,245, the content of which is incorporated herein by reference.

Figure 12:
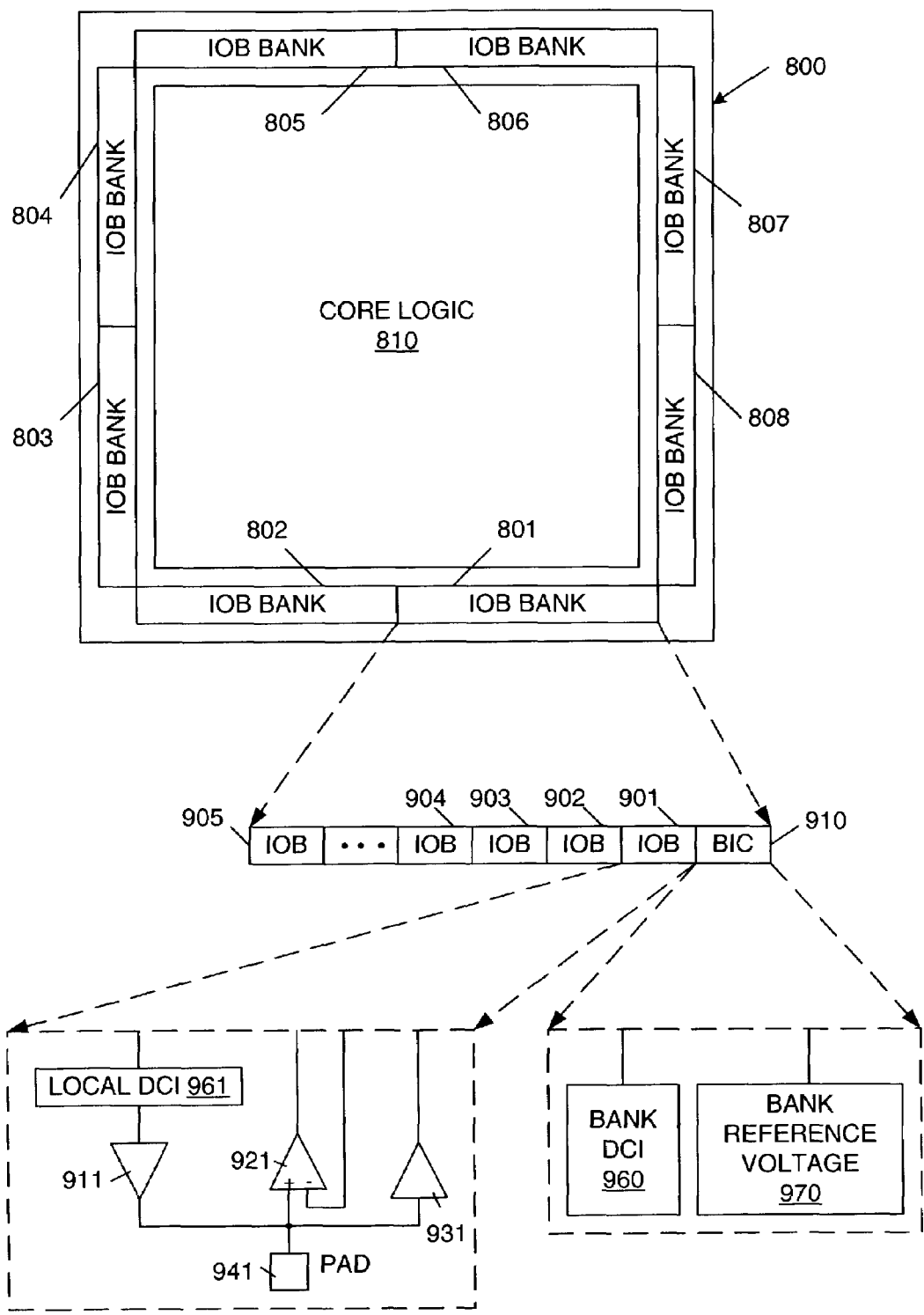
FIG. 12 is a block diagram of an integrated circuit chip.

FIG. 12 is a block diagram of an integrated circuit chip 800. IC chip 800 includes eight input/output block (IOB) banks 801–808 and core logic 810. IOB banks 801–808 are substantially identical. In a particular embodiment, core logic 810 includes an array of configurable logic blocks and programmable interconnect circuitry. However, other core logic is contemplated. In general, IOB banks 801–808 provide an interface between core logic 810 and circuitry external to chip 800.

In the described embodiment, two IOB banks are located along each edge of IC chip 800, with each IOB bank having 20 to 150 IOBS. An exploded view illustrates that IOB bank 801 includes a plurality of IOBs 901–905 and a bank impedance control (BIC) circuit 910. A further exploded view illustrates that IOB 901 includes output driver circuit 911, comparator 921, input buffer circuit 931, I/O pad 941 and local digitally controlled impedance (DCI) circuit 961. Yet another exploded view illustrates that bank impedance control circuit 910 includes a bank digitally controlled impedance (DCI) circuit 960 and bank reference voltage generator 970. As described in more detail below, local DCI circuit 961 and bank DCI circuit 960 combine to perform the functions of DCI circuit 201 (FIGS. 6–8). As also described in more detail below, bank reference voltage generator 970 provides the reference voltages that are used by IOBs 901–905. Thus, bank reference voltage generator 970 performs the functions of reference voltage circuits 311 and 411 (FIGS. 7 and 8).

In another embodiment, only one bank impedance control circuit 910 is provided for the entire chip 800. In this embodiment, bank impedance control circuit 910 provides the necessary control for all of the local DCI circuits on chip 800. In another embodiment, there are multiple bank impedance control circuits, which are capable of controlling one or more IOB banks.

Figure 13:
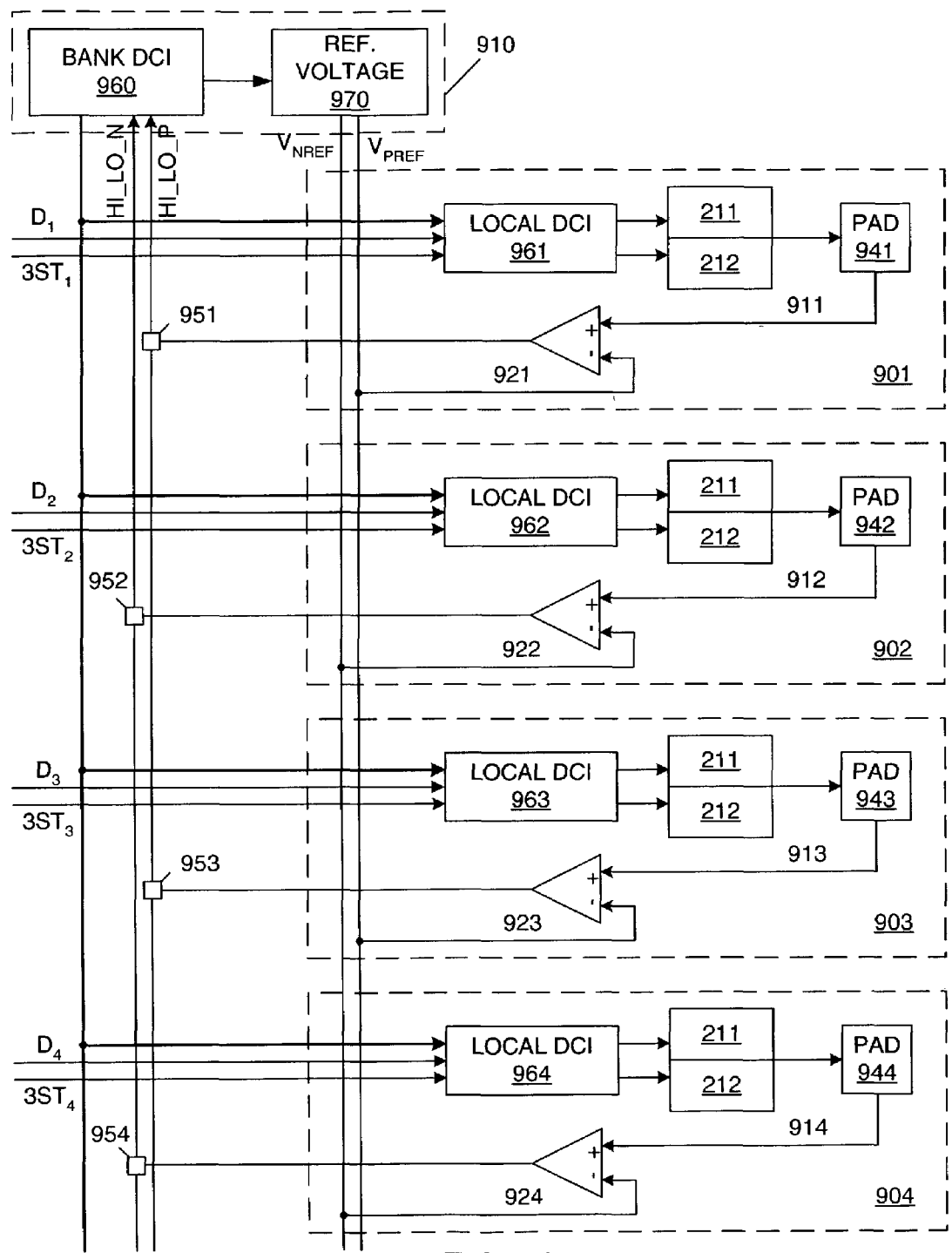
FIG. 13 is a circuit diagram illustrating selected portions of an IOB bank, including a bank impedance control circuit and selected IOBS.

FIG. 13 is a circuit diagram illustrating selected portions of IOB bank 801, including bank impedance control circuit 910 and IOBs 901–904. Note that the input buffer circuits (e.g., input buffer circuit 931) are not shown in FIG. 13 for purposes of clarity. IOBs 901–904 include respective local DCI circuits 961–964, respective output driver circuits 911–914, respective comparators 921–924 and respective I/O pads 941–944. Each of output driver circuits 911–914 includes a set of p-channel transistors 211 and a set of n-channel transistors 212, as described above in connection with FIGS. 6–8.

Reference voltage generator 970 provides the n-channel reference voltage, $V_{NREF}$, and the p-channel reference voltage $V_{PREF}$, on lines that extend through IOB bank 801. The comparator in every odd numbered IOB (e.g., 901, 903, 905) in IOB bank 801 is coupled to receive the $V_{PREF}$ voltage. The comparator in every even numbered IOB (e.g., 902, 904) in IOB bank 801 is coupled to receive the $V_{NREF}$ voltage.

The output terminals of the comparators in odd numbered IOBs are coupled to programmable connections (e.g., 951, 953), which if programmed, will connect a corresponding comparator to a common HI_LO_P line. Similarly, the output terminals of the comparators in even numbered IOBs are coupled to programmable connections (e.g., 952, 954), which if programmed, will connect a corresponding comparator to a common HI_LO_N line. The HI_LO_P line and the HI_LO_N line are routed to bank DCI circuit 960.

Bank DCI circuit 960 also provides control signals to local DCI circuits 961–964. These control signals will be described in more detail below. In general, IOB bank 801 operates as follows. One of the odd-numbered IOBs is selected to be a p-channel reference circuit, and one of the even-numbered IOBs is selected to be an n-channel reference circuit. This selection is made by setting a configuration memory bit in the local DCI circuit of each of these IOBS, and programming the connection to couple the output terminals of the comparators of these IOBs to the HI_LO_N and HI_LO_P lines. Although any one of the odd-numbered IOBs can be selected to be the p-channel reference circuit, IOB 901 is selected in the described embodiment. Thus, a configuration memory bit in local DCI circuit 961 is set, and programmable connection 951 is enabled. Similarly, although any one of the even-numbered IOBs can be selected to be the n-channel reference circuit, IOB 902 is selected in the described embodiment. Thus, a configuration memory bit in local DCI circuit 962 is set, and programmable connection 952 is enabled.

Because IOB 901 is to serve as the p-channel reference circuit, a predetermined reference resistance $R_{PREF}$ is connected between pad 941 and the ground terminal in the manner illustrated in FIG. 7. As a result, IOB 901 is configured in substantially the same manner illustrated in FIG. 7, except that the DCI circuit 201 of FIG. 7 has been divided into bank DCI circuit 960 and local DCI circuit 961.

Because IOB 902 is to serve as the n-channel reference circuit, a predetermined reference resistance $R_{NREF}$ is connected between pad 942 and an external $V_{cc}$ supply terminal in the manner illustrated in FIG. 8. As a result, IOB 902 is configured in substantially the same manner illustrated in FIG. 8, except that the DCI circuit 201 of FIG. 8 has been divided into bank DCI circuit 960 and local DCI circuit 962.

In general, IOB bank 801 operates as follows. P-channel reference circuit 901 and n-channel reference circuit 902 are initially set to have predetermined turned-on p-channel and n-channel transistors. During a first time period, bank DCI circuit 960 processes the HI_LO_P signal provided by p-channel reference circuit 901. In response, bank DCI circuit 960 instructs local DCI circuit 961 to enable/disable the p-channel transistors in driver circuit 911 in the manner described above in connection with FIG. 7. At the same time, bank DCI circuit 960 also instructs other local DCI circuits to enable/disable the same p-channel transistors as local DCI circuit 961. Thus, when logic low data signals D3–D4 are applied to local DCI circuits 963–964, these local DCI circuits will enable the same p-channel transistors determined by the p-channel reference circuit 901. For example, if bank DCI circuit 960 instructs local DCI circuit 961 in the p-channel reference circuit 901 to enable fine p-channel transistors P1–P4 and coarse p-channel transistor P14, then bank DCI circuit 960 will similarly instruct local DCI circuit 963 to enable fine p-channel transistors P1–P4 and coarse p-channel transistor P14 when data signal D3 has a logic low value.

During a second time period, bank DCI circuit 960 processes the HI_LO_N signal provided by n-channel reference circuit 902. In response, bank DCI circuit 960 instructs local DCI circuit 962 to enable/disable the n-channel transistors in driver circuit 912 in the manner described above in connection with FIG. 8. Bank DCI circuit 960 also instructs other local DCI circuits to enable/disable the same n-channel transistors as local DCI circuit 962. Thus, if bank DCI circuit 960 instructs local DCI circuit 962 in the n-channel reference circuit 902 to enable fine n-channel transistors N1–N2 and coarse n-channel transistor N13, then bank DCI circuit 960 will similarly instruct local DCI circuit 963 to enable fine n-channel transistors N1–N2 and coarse n-channel transistor N13 when data signal D3 has a logic high value.

In accordance with another embodiment, the IOB 904 can be configured in a manner different than IOB 903. For example, output driver circuit 913 of IOB 903 can be configured in response to different reference voltages ($V_{NREF}$ and $V_{PREF}$) than output driver circuit 914 of IOB 904. As a result, output driver circuit 913 will exhibit different resistances than output driver circuit 914. This is accomplished by providing different sets of reference voltages with reference voltage supply 970.

Reference voltage supply 970 can be controlled to provide different reference voltages $V_{PREF}$ and $V_{NREF}$ at different times. For example, reference voltage supply 970 can be controlled to provide a first set of reference voltages that are used by p-channel and n-channel reference circuits 901 and 902 to determine the appropriate p-channel and n-channel transistors to be enabled within IOB 903. Reference voltage supply 970 can also be controlled to provide a second set of reference voltages that are used by p-channel and n-channel reference circuits 901 and 902 to determine the appropriate p-channel and n-channel transistors to be enabled within IOB 904. In the described embodiment, reference voltage supply 970 can be controlled to provide up to four sets of reference voltages. By providing different reference voltages, the on-resistances of different output driver circuits can be controlled to have different values, even though the resistances of the external reference resistors 305 and 405 remain constant. Bank DCI circuit 960 is able to address the local DCI circuits 961–964, such that the appropriate information is provided to the appropriate IOBs.

Figure 14:
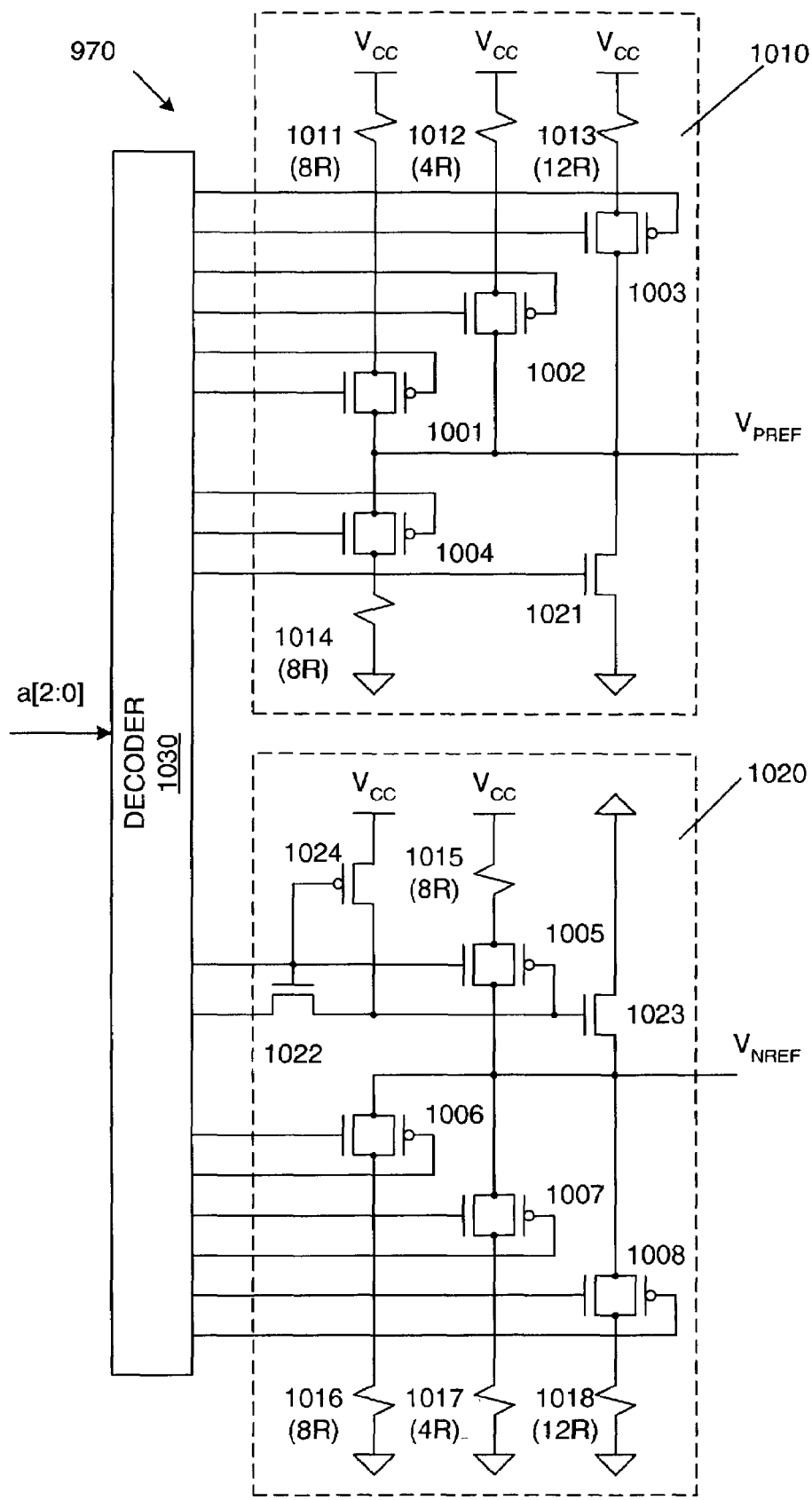
FIG. 14 is a circuit diagram of a reference voltage supply.

FIG. 14 is a circuit diagram of reference voltage supply 970. Reference voltage supply 970 includes p-channel reference voltage generator 1010, n-channel reference voltage generator 1020 and decoder circuit 1030. P-channel reference voltage generator 1010 includes transmission gates 1001–1004, resistors 1011–1014 and n-channel transistor 1021. Resistors 1011, 1012, 1013 and 1014 have relative resistances of 8R, 4R, 12R and 8R, respectively. N-channel reference voltage generator 1020 includes transmission gates 1005–1008, resistors 1015–1018, n-channel transistors 1022–1023 and p-channel transistor 1024. Resistors 1015, 1016, 1017 and 1018 have relative resistances of 8R, 8R, 4R and 12R, respectively. Decoder circuit receives address signals a [2:0] from bank DCI circuit 960, and in response, provides control signals to transmission gates 1001–1008 and transistors 1021–1023. Table 1 summarizes the status of transmission gates 1001–1004, transistor 1021 and the p-channel reference voltage $V_{PREF}$ for the various address signals a [2:0].

TABLE 1

| a[2:0] | 1001 | 1002 | 1003 | 1004 | 1021 | $V_{PREF}$ |
|---|---|---|---|---|---|---|
| 000 | OFF | OFF | OFF | OFF | ON | 0 |
| 101 | | | | | | |
| 110 | | | | | | |
| 111 | | | | | | |

TABLE 1-continued

| a[2:0] | 1001 | 1002 | 1003 | 1004 | 1021 | $V_{PREF}$ |
|---|---|---|---|---|---|---|
| 001 | ON | OFF | OFF | ON | OFF | $V_{CC}/2$ |
| 010 | OFF | ON | OFF | ON | OFF | $2V_{CC}/3$ |
| 011 | ON | OFF | OFF | ON | OFF | $V_{CC}/2$ |
| 100 | OFF | OFF | ON | ON | OFF | $2V_{CC}/5$ |

Table 2 summarizes the status of transmission gates 1005–1008, transistor 1022–1024 and the n-channel reference voltage $V_{NREF}$ for the various address signals a [2:0].

TABLE 2

| a[2:0] | 1005 1022 | 1006 | 1007 | 1008 | 1023 1024 | $V_{NREF}$ |
|---|---|---|---|---|---|---|
| 000 | OFF | OFF | OFF | OFF | ON | 0 |
| 101 | | | | | | |
| 110 | | | | | | |
| 111 | | | | | | |
| 001 | ON | ON | OFF | OFF | OFF | $V_{CC}/2$ |
| 010 | ON | OFF | ON | OFF | OFF | $V_{CC}/3$ |
| 011 | ON | ON | OFF | OFF | OFF | $V_{CC}/2$ |
| 100 | ON | OFF | OFF | ON | OFF | $3V_{CC}/5$ |

Addresses of "001" or "010" are used to provide DCI output driver circuits with different impedances (FIG. 9A). An address of "011" is used to provide a single termination pull-up to $V_{cc}$ (FIG. 10B). An address of "100" is used to provide a split termination to $V_{cc}$ and ground (FIG. 11B).

Figure 15:
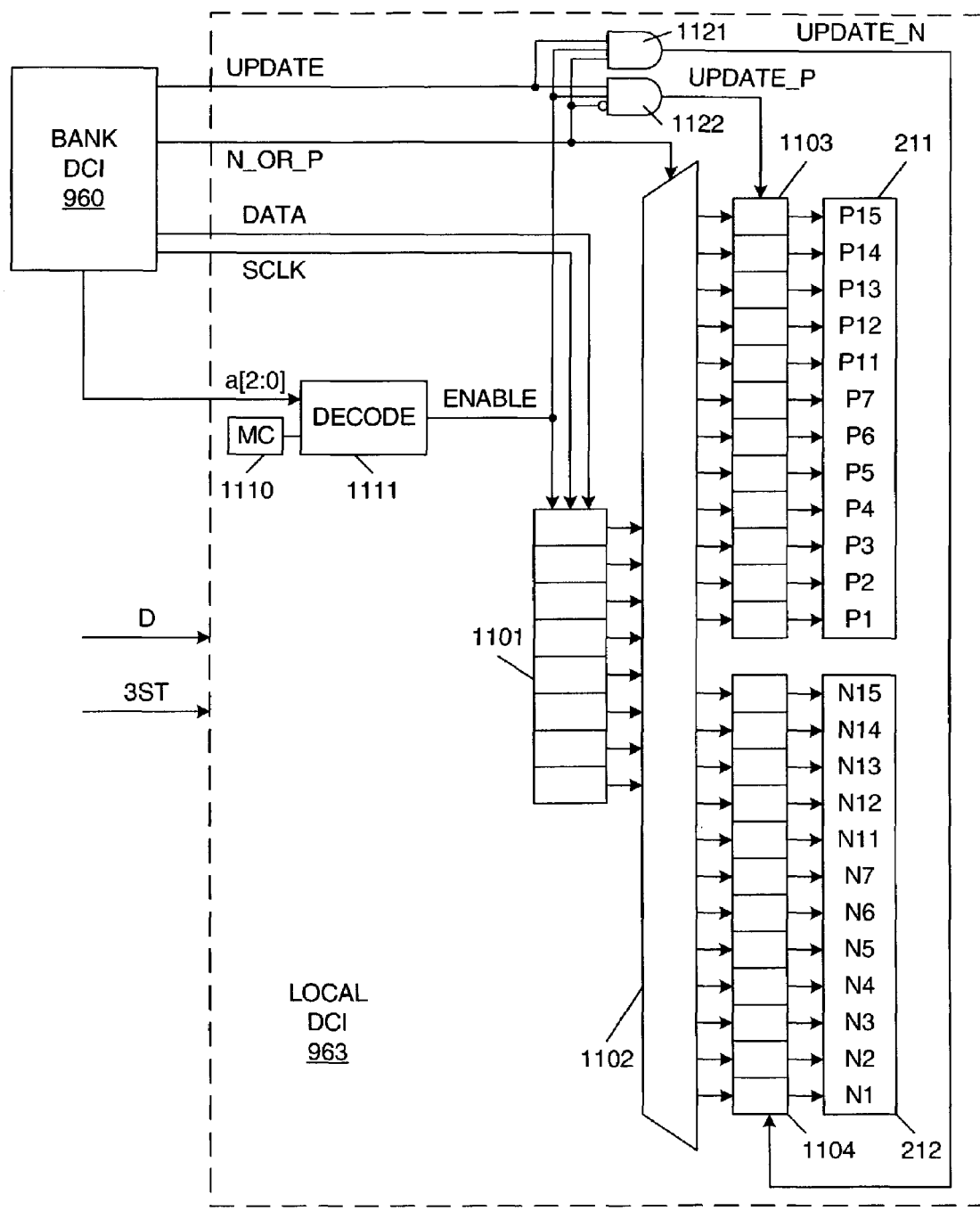
FIG. 15 is a block diagram illustrating a bank DCI circuit and a local DCI circuit.

FIG. 15 is a block diagram illustrating bank DCI circuit 960 and local DCI circuit 963 in more detail. Local DCI circuits 961–962 and 964 are identical to local DCI circuit 963.

Local DCI circuit 963 includes shift register 1101, data decoder 1102, p-channel register 1103, n-channel register 1104, configuration memory cells 1110, address decoder 1111 and logical AND gates 1121–1122. Bank DCI circuit 660 and local DCI circuit 663 operate as follows.

Configuration memory cells 1110 store four configuration bits. One of these configuration bits indicates whether IOB 903 will serve as a reference IOB. If this configuration bit is set, then address decoder 1111 will assert an ENABLE signal regardless of the state of the applied address signal a [2:0]. The remaining three configuration bits identify a "type" of the output driver circuit 913 (assuming that IOB 903 is not a reference IOB). There are five "types" of output driver circuits in accordance with the described embodiment. Table 3 defines the reference voltages used for each of the five types. Note that the contents of configuration memory cells 1110 will correspond with one of the address signals a [2:0].

TABLE 3

| Type Configuration Memory Cells 1110 | $V_{PREF}$ | $V_{NREF}$ |
|---|---|---|
| 000, 101, 110, 111 | 0 | 0 |
| 001 | $V_{CC}/2$ | $V_{CC}/2$ |
| 010 | $V_{CC}/3$ | $2V_{CC}/3$ |
| 011 | $V_{CC}/2$ | $V_{CC}/2$ |
| 100 | $3V_{CC}/5$ | $2V_{CC}/5$ |

If the address signal a [2:0] from bank DCI circuit 960 matches the contents of configuration memory cells 1110, then address decoder 1111 will assert an ENABLE signal, thereby enabling shift register 1101. In response to this ENABLE signal (and a SCLK clock signal provided by bank DCI circuit 960), shift register 1101 will sequentially shift in the DATA signal provided by bank DCI circuit 960. The DATA signal identifies the p-channel transistors 211 or the n-channel transistors 212 to be turned on during the present iteration. Shift register 1101 provides the loaded DATA values to data decoder 1102.

Bank DCI circuit 960 provides a N_OR_P control signal to data decoder 1102, thereby indicating whether the contents of shift register 1101 are intended to control the p-channel transistors 211 (N_OR_P=0), or the n-channel transistors 212 (N_OR_P=1) of output driver circuit 913. Bank DCI circuit 960 initially provides a N_OR_P signal having a logic "0" value. In response, data decoder 1102 will decode the contents of shift register 1101, and transmit the results to p-channel register 1103.

Bank DCI circuit 960 then asserts a logic high UPDATE signal, which causes AND gate 1121 to assert a logic high UPDATE_P signal. In response, p-channel register 1103 loads the results provided by data decoder 1102. The contents of p-channel register 1103 are then used to control p-channel transistors P1–P7 and P11–P15 in the manner described above.

Data decoder 1102 operates as follows. Data decoder receives the 8-bit signal D[7:0] received from shift register 1101. The D[7:0] signal includes five bits D[7:3] to control coarse transistors (i.e., coarse p-channel transistors P11–P15 or coarse n-channel transistors N11–N15). These five bits D[7:3] are routed directly through decoder 1102 to either register 1103 or 1104 in response to the N_OR_P signal. The D[7:0] signal also includes three bits D[2:0] to control fine transistors (i.e., fine p-channel transistors P1–P7 or fine n-channel transistors N1–N7). Decoder 1102 provides signals that will turn on 0 to 7 of the fine transistors in response to the D[2:0] bits.

The operation of IOB bank 801 will now be summarized. First, one of IOBs 901–905 is configured as a p-channel reference circuit, and another one of IOBs 901–905 is configured as an n-channel reference circuit. The remaining IOBs are configured to have a particular 'type' (e.g., a first type, a second type, etc.) by appropriately programming the configuration memory cells 1110 within the IOBS.

Bank DCI circuit 960 then asserts a first address signal $a_1$[2:0] (e.g., "001") and a first data signal $D_1$[7:0]. The first address signal $a_1$[2:0] causes reference voltage circuit 970 to generate a first pair of reference voltages $V_{PREF1}$ and $V_{NREF1}$ (e.g., $V_{cc}/2$ and $V_{cc}/2$). The first data signal $D_1$[7:0], which identifies p-channel transistors to be enabled, is latched into the p-channel reference IOB. The first address signal $a_1$[2:0] also causes the first data signal $D_1$[7:0] to be latched into all of the IOBs of the first type.

The bank DCI circuit 960 then provides a logic low N_OR_P signal and a logic high UPDATE signal, thereby causing the first data signal $D_1$[7:0] to be decoded and used to control the p-channel transistors in both the p-channel reference circuit and the IOBs of the first type. In response, the p-channel reference circuit provides a HI_LO_P signal having a logic high or low value to bank DCI circuit 960. This process is repeated until the p-channel reference circuit has provided the desired p-channel settings to all of the IOBs of the first type.

The address signal a[2:0] is then incremented to the second type ("010"), such that the reference voltage circuit 970 generates a second pair of reference voltages. In response, the p-channel reference circuit is used to provide the desired p-channel settings to all of the IOBs of the second type.

This process is repeated such that the desired p-channel settings are provided for all of the different types of IOBs. The n-channel reference circuit is then used to provide the desired n-channel settings for the different types of IOBs.

To provide the desired settings for the n-channel transistors, bank DCI circuit 960 asserts the first address signal $a_1$[2:0] and then provides a data signal $D_2$[7:0]. This data signal $D_2$[7:0], which identifies n-channel transistors to be enabled, is latched into the n-channel reference circuit. The first address signal $a_1$[2:0] also enables the second data signal $D_2$[7:0] to be latched into all of the IOBs of the first type.

The bank DCI circuit 960 then provides a logic high N_OR_P signal and a logic high UPDATE signal, thereby causing the data signal $D_2$[7:0] to be decoded and used to control the n-channel transistors in both the n-channel reference circuit and the IOBs of the first type. In response, the n-channel reference IOB provides a HI_LO_N signal having a logic high or low value to bank DCI circuit 960. This process is repeated until the n-channel reference circuit has provided the desired n-channel settings to all of the IOBs of the first type.

The address signal a[2:0] is then incremented to the second type ("010"), such that the reference voltage circuit 970 generates a second pair of reference voltages. In response, the n-channel reference circuit is used to provide the desired n-channel settings to all of the IOBs of the second type.

This process is repeated such that the desired n-channel settings are provided for all of the different types of IOBs. The process then repeats, with the p-channel transistor settings being updated for the various types, and then the n-channel transistor settings being updated for the various types. In this manner, the p-channel and n-channel determinations are continuously being updated for each type during operation of the chip.

Note that IOBs can be excluded from this process by programming the configuration memory cells 1110 to store a 3-bit value of "000", "101", "110" or "111". In this case, the p-channel and n-channel transistors to be enabled are determined by the user programming configuration memory cells.

Though connection with the control of output driver circuits has been described, it is understood that the DCI may be applied to circuits which do not drive output signals. For example, selection of which parallel-connected transistors should be turned on between any node and a voltage supply terminal may be done. In addition the DCI block 201 can be implemented as a state machine. In addition, although p-channel transistors have been used as pull-up elements, and n-channel transistors have been used as pull-down elements, n-channel transistors can be used as pull-up elements and p-channel transistors can be used as pull-down elements in other embodiments.

Duty Cycle Adjust System

Figure 16A:
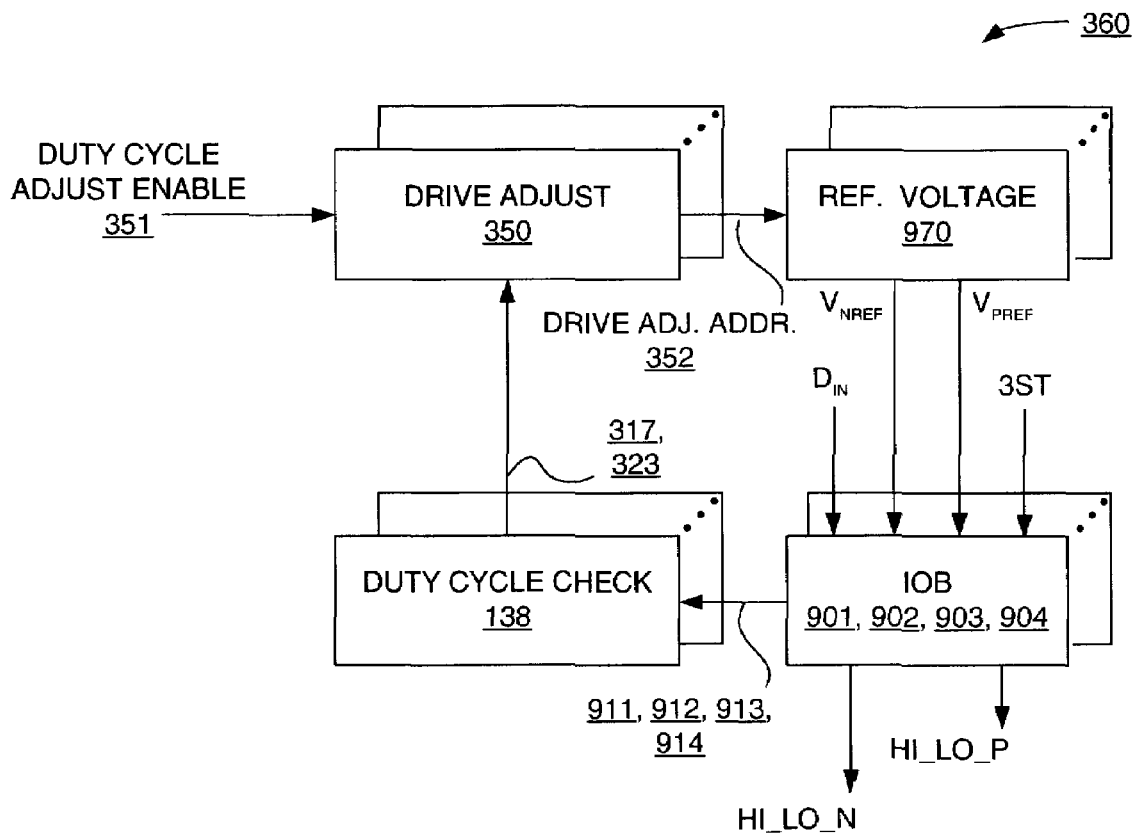
FIG. 16A is a block diagram of an exemplary embodiment of a duty cycle adjust system in accordance with one or more aspects of the present invention.

Referring to FIG. 16A, there is shown a block diagram of an exemplary embodiment of a Duty Cycle Adjust System 360 in accordance with one or more aspects of the present invention. Duty Cycle Adjust System 360 comprises a drive adjust 350 reference voltage 970 one or more IOBs 901, 902, 903, 904 and one or more duty cycle checks circuits 138. A duty cycle adjust enable signal 351 is provided to drive adjust 350. Duty cycle adjust enable signal 351 is to inform drive adjust 350 of a selected duty cycle to be used, such as a 50—50 duty cycle, a $^{60}/_{40}$ duty cycle, a $^{40}/_{60}$ duty cycle, or some other desired duty cycle with respect to n-channel and p-channel driving transistors. As mentioned above, I/O drive transistors may be selected in order to provide a desired impedance. Moreover, such I/O n-channel and p-channel type transistors may be selected to provide a desired duty cycle, as is explained. Drive adjust signal 350 provides drive adjust address 352 in response to a desired duty cycle as indicated by duty cycle adjust enable signal 351.

Drive adjust address signal 352 is provided to reference voltage generator 970. Reference voltage generator 970 provides n-channel and p-channel reference voltages, namely, $V_{NREF}$ and $V_{PREF}$ voltages. These reference voltages are provided to an IOB, such as IOB 901, 902, 903 and 904. Conventionally, n-channel and p-channel transistors formed from a same process on a same semiconductor integrated circuit and in near proximity to one another will behave substantially similarly, that is all n-channel transistors will act substantially similar to one another and all p-channel transistors will act substantially similar to one another, so it is possible to provide only two reference voltages, one n-channel and one p-channel, to a plurality of IOBS.

However, if one so desires, it is possible to have different duty cycles on different I/Os. Thus, a plurality of duty cycle adjust enable signals 351 may be provided to a plurality of drive adjust circuits 350 to produce respective drive adjust address signals 352 to reference voltage generators 970 for generating a plurality of respective reference voltages for respective IOBS, such as IOBs 901, 902, 903, and 904. Each of these IOBs can provide a signal sample 911, 912, 913, 914 as an input to a respective duty cycle check circuit 138 to provide respective duty cycle indicator signals 317, 323. However, for simplicity, it will be assumed that only a single duty cycle indicator signal 317 or 323 is used for a plurality of IOBs, and thus use of only one output signal sample, such as output signal sample 911, is described. Accordingly, drive adjust circuit 350 receives a duty cycle indicator signal 317 or 323, and compares it to a desired duty cycle as indicated by duty cycle adjust enable signal 351. Drive adjust circuit 350 in response to this comparison can provide a new drive adjust address signal 352 to reference voltage generator 970 in the event that a duty cycle indicator signal 317 or 323 is not within an acceptable limit of a desired duty cycle as indicated by duty cycle adjust enable signal 351. Thus, reference voltage generator 970, in the event that a duty cycle needs further adjustment, can compensate by altering one or more reference voltages output to one or more IOBs. Of course, however, if duty cycle indicator signal 317 or 323 is within an acceptable limit, then drive adjust address signal 352 does not need to be adjusted from a prior iteration.

Alternatively, reference voltage generator 970 may be coupled to body or well bias voltages for IOBs 901, 902, 903 and 904. Thus, $V_{NREF}$ and $V_{PREF}$ voltages would be coupled to NMOS and PMOS wells, respectively, to adjust such body biases. Notably, double isolated well structures, among other well configurations, may be used, and thus using $V_{PREF}$ voltages to bias an n-well to affect threshold voltage for a p-channel device, as well as using $V_{NREF}$ voltage to bias a p-well to affect threshold voltage for an n-channel device, may be done. By changing one or more body biases, drive strengths of PMOS and NMOS transistors may be brought into balance, or otherwise tuned, depending on application.

Figure 16B:
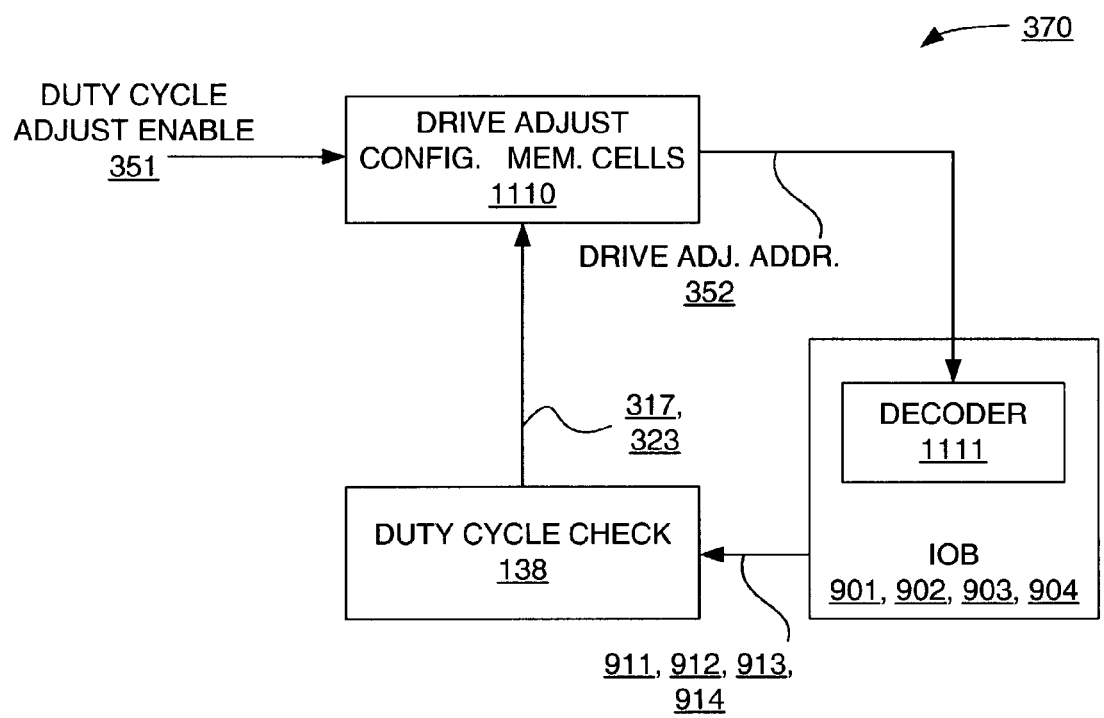
FIG. 16B is a block diagram of a exemplary embodiment of a programmable duty cycle adjust system in accordance with one or more aspects of the present invention.

Referring to FIG. 16B, there is shown a block diagram of an exemplary embodiment of a programmable duty cycle adjust system 370 in accordance with one or more aspects of the present invention. Programmable duty cycle adjust system 370 has similar elements and signals with respect to duty cycle adjust system 360 of FIG. 16A, and accordingly for clarity similar aspects are not repeated. Programmable duty cycle adjust system 370 has drive adjust configuration memory cells 1110 instead of drive adjust circuitry 350. Drive adjust configuration memory cells 1110 may be programmed in response to a duty cycle adjust enable signal 351. Prior to programming, drive adjust configuration memory cells 1110 may have a standard duty cycle default, such as the ⁵⁰⁄₅₀ duty cycle. However, if some duty cycle other than the default duty cycle is desired or if duty cycle must be selected, duty cycle adjust enable signal 351 may be provided in order to cause drive adjust configuration memory cells 1110 to be programmed to provide a different drive adjust address 352 to decoder 1111 of one or more IOBs. Decoder 1111 of IOBs 901, 902, 903, 904 receives drive adjust address signal 352 in order to select one or more additional p-channel or n-channel drive transistors in order to tailor duty cycle to that programmed into drive adjust configuration memory cells 1110. Using direct addressing of an IOB to provide selection of drive transistors to adjust duty cycle avoids use of reference voltage generator 970 of FIG. 16A for this capacity. Accordingly, after direct addressing of an IOB to select drive transistors is done, output from such an IOB may be sampled, as described above and provided to one or more duty cycle check circuits 138 to provide one or more duty cycle indicator signals 317 or 323. Duty cycle indicator signals 317 and 323 provide feed-back control to drive adjust configuration memory cells 1110 for purposes of determining whether or not output of an IOB is within acceptable limits of a desired programmed duty cycle.

Accordingly, it should be appreciated that by inferring threshold voltage ratio for n-channel and p-channel transistors, $V_{tn}/V_{tp}$, from duty cycle, circuits can be configured to meet performance criteria, not only off a production line, but also over time as stability of threshold voltages of transistors degrades. Moreover, threshold voltage ratio for n-channel and p-channel transistors may be changed during operation. Additionally, devices which would not yield due to threshold voltage ratio for n-channel and p-channel transistors may be adjusted to be acceptable parts. Furthermore, it should be appreciated that as devices are scaled down, threshold voltage conventionally tends be become less stable, so this ability to adjust enhances ability to scale down transistors. However, $V_{tn}/V_{tp}$ ratio may be adjusted as described independent of transistor size.

While the foregoing is directed to embodiments of the present invention, other and further embodiments of the invention may be devised without departing from the basic scope thereof, and the scope thereof is determined by the claims that follow. For example, drive transistors were described; however, transistors for oscillators and flip-flops—especially toggle flip-flops, among other known devices dependent on $V_{tn}/V_{tp}$ ratio may be adjusted in accordance with one or more aspects of the present invention.

The invention claimed is:

1. A method for on-chip testing of duty cycle proportion at an input/output node, comprising:
generating a test signal on-chip, the test signal having a non-zero frequency;
generating a duty cycle on-chip for the test signal;
obtaining at least a portion of the test signal on-chip at the input/output node, including programming an input/output block to output the test signal and buffering the test signal output at an input/output pad of the input/output block; and checking the duty cycle obtained on-chip at the input/output node to determine the proportion at the input/output node.

2. The method according to claim 1, wherein the test signal is created with an externally or internally sourced clock signal.

3. The method according to claim 1, wherein the step of generating the duty cycle comprises providing the test signal to a divide-by-two circuit.

4. The method according to claim 1, wherein the integrated circuit under test is a programmable logic device.

5. The method according to claim 4, wherein the programmable logic device is selected from a field programmable gate array and a complex programmable logic device.

6. The method according to claim 5, wherein the step of generating a duty cycle comprises passing the test signal through a digital clock manager.

7. The method according to claim 1, wherein the step of checking comprises:
providing the test signal to a digital clock manager;
generating with the digital clock manager a phase/shifted version of the test signal, the phase shifted version of the test signal being approximately 180° out of phase with the test signal prior to phase shifting; and
comparing the phase-shifted version of the test signal to the test signal without phase-shifting.

8. The method according to claim 1, wherein the step of checking the duty cycle comprises:
counting ones and zeros of the test signal; and
determining a ratio for the ones and zeros counted.

9. An apparatus for on-chip testing of an n-type to p-type transistor threshold voltage ratio for an on-chip bi-directional input/output (I/O) block, comprising:
an on-chip oscillator configured to generate a waveform;
an on-chip divide-by circuit coupled to receive the waveform and to provide a duty cycle for the waveform;
the bi-directional I/O block including an input buffer and an output buffer, the bi-directional I/O block coupled to receive the waveform having the duty cycle at the input buffer and to sample the waveform with the output buffer; and
an on-chip phase comparator circuit coupled to the output buffer to receive the waveform sample and configured to generate a phase-shifted waveform sample and to provide an indication of whether the n-type to p-type transistor threshold voltage ratio of the bi-directional I/O block is balanced.

10. The apparatus according to claim 9, wherein the oscillator is an internally or externally sourced clock signal.

11. The apparatus according to claim 9, wherein the divide-by circuit is a flip-flop.

12. The apparatus according to claim 9, wherein the divide-by circuit is a digital clock manager, the digital clock manager being incorporated into of one of a field programmable gate array and a complex programmable logic device.

13. The apparatus according to claim 9, wherein the bi-directional I/O block is in one of a field programmable gate array and a complex programmable logic device.

14. The apparatus according to claim 9, wherein the phase comparator circuit comprises a digital clock manager configured to generate an approximately 180° phase-shifted waveform.

15. The apparatus according to claim 14, wherein the phase comparator circuit comprises comparator logic coupled to receive the waveform and the phase-shifted waveform and configured to provide an indication of whether an n-type to p-type transistor threshold voltage ratio of the bi-directional I/O block is balanced.

16. An apparatus for built-in self-testing of n-type to p-type transistor threshold voltage ratio for a built-in bi-directional input/output (I/O) block of a programmable logic device, the apparatus comprising:
a built-in oscillator configured to generate a test signal;
a built-in divide-by circuit coupled to receive the test signal and configured to generate the test signal with a duty cycle;
the bi-directional I/O block including complementary-metal-oxide-semiconductor (CMOS) input and output buffers, the bi-directional I/O block coupled to receive the test signal and programmed to provide the test signal as an output and to sample the output;
built-in counters coupled to receive the output and to count ones and zeros of the output;
a built-in sample clock signal provided to the counters and synchronized with the test signal, the sample clock signal having a frequency in excess of that of the test signal; and
a built-in compare logic circuit configured to receive outputs from the counters to determine the n-type to p-type transistor threshold voltage ratio.

17. The apparatus according to claim 16, wherein the divide-by circuit is a flip flop.

18. The apparatus according to claim 16, wherein the divide-by circuit is a digital clock manager.

19. The apparatus according to claim 16, wherein the counters are coupled in parallel.

20. A method for adjusting a duty cycle, comprising:
providing a duty cycle indicator signal, the duty cycle indicator signal indicating duty cycle of an output signal; and
selecting at least one transistor of a plurality of n-channel and p-channel transistors in response to the duty cycle indicator signal to adjust the duty cycle of the output signal.

21. The method according to claim 20, further comprising receiving a duty cycle adjust enable signal indicating the duty cycle to be obtained.

22. The method according to claim 21, further comprising generating a drive adjust address signal in response to the duty cycle adjust enable signal.

23. The method according to claim 22 further comprising generating a plurality of reference voltages in response to the drive adjust address signal.

24. The method according to claim 20, wherein the output signal is obtained from a programmable logic device input/output block.

25. The method according to claim 24, further comprising providing a plurality of reference voltages to the programmable logic device input/output block to obtain the output signal.

26. The method according to claim 21, further comprising programming configuration memory cells in response to the duty cycle adjust enable signal.

27. The method according to claim 26, wherein the configuration memory cells cause generating a drive adjust address signal.

28. The method according to claim 27, wherein the step of selecting comprises:
receiving the drive adjust address signal; and
decoding the drive adjust address signal.

29. The method according to claim 28, wherein the drive adjust address signal is received by a programmable logic device input/output block for the step of decoding, the programmable logic device input/output block comprising a decoder.

30. A duty cycle adjust system, comprising:

drive adjust circuitry coupled to receive a duty cycle adjust enable signal and configured to provide a drive adjust address signal in response to the duty cycle adjust enable signal;

a reference voltage generator coupled to receive the drive adjust address signal and configured to provide a plurality of reference voltages in response to the drive adjust address signal;

an output buffer coupled to receive the plurality of reference voltages and configured to select at least one p-channel drive transistor and at least one n-channel drive transistor in response to the plurality of reference voltages, the output buffer configured to sample an output signal to provide an output signal sample;

duty cycle check circuitry coupled to receive the output signal sample and configured to provide a duty cycle indicator signal in response to the output signal sample, the output signal sample having a duty cycle responsive to the plurality of reference voltages; and the drive adjust circuitry coupled to receive the duty cycle indicator signal and configured to provide another drive adjust address signal in response to the duty cycle indicator signal.

31. The system according to claim 30 wherein the output buffer is a portion of a programmable logic device input/output block.

32. A programmable duty cycle adjust system, comprising:

configuration memory cells coupled to receive a duty cycle adjust enable signal and configured to provide a drive adjust address signal in response to the duty cycle adjust enable signal;

an output buffer coupled to receive the drive address adjust address signal and configured to decode the drive adjust address signal to select at least one n-channel transistor and at least one p-channel transistor of a plurality of n-channel transistors and a plurality of p-channel transistors, respectively, the output buffer configured to sample an output signal to provide an output signal sample, the output signal sample having a duty cycle responsive to the drive adjust address signal as decoded;

duty cycle check circuitry coupled to receive the output signal sample and configured to provide a duty cycle indicator signal in response to the output signal sample; and the configuration memory cells coupled to receive the duty cycle indicator signal and configured to provide another drive adjust address signal in response to the duty cycle indicator signal, wherein the other drive adjust signal is configured to direct adjustment of duty cycle toward a target duty cycle range.

33. The system according to claim 32, wherein the output buffer comprises a decoder.

34. The system according to claim 32, wherein the output buffer is a portion of a programmable logic device input/output block.

35. A method for adjusting transistor drive, comprising:

determining duty cycle for a signal, the duty cycle being at least partially responsive to at least one n-channel transistor and at least one p-channel transistor used for propagating the signal; and adjusting drive voltage on at least one of the at least one n-channel transistor and the at least one p-channel transistor in response to the duty cycle.

36. The method according to claim 35, wherein the signal is propagated through a buffer formed at least in part by the at least one n-channel transistor and the at least one p-channel transistor.

37. The method according to claim 35, wherein the signal is propagated through an oscillator formed at least in part by the at least one n-channel transistor and the at least one p-channel transistor.

38. The method according to claim 35, wherein the signal is propagated through a flip-flop formed at least in part by the at least one n-channel transistor and the at least one p-channel transistor.

* * * * *